(12) United States Patent
Salcedo et al.

(10) Patent No.: US 8,680,620 B2
(45) Date of Patent: Mar. 25, 2014

(54) BI-DIRECTIONAL BLOCKING VOLTAGE PROTECTION DEVICES AND METHODS OF FORMING THE SAME

(75) Inventors: Javier A Salcedo, North Billerica, MA (US); Michael Lynch, Limerick (IE); Brian Moane, Limerick (IE)

(73) Assignee: Analog Devices, Inc., Norwood, MA (US)

( * ) Notice: Subject to any disclaimer, the term of this patent is extended or adjusted under 35 U.S.C. 154(b) by 211 days.

(21) Appl. No.: 13/198,208

(22) Filed: Aug. 4, 2011

(65) Prior Publication Data
US 2013/0032882 A1    Feb. 7, 2013

(51) Int. Cl.
*H01L 23/62* (2006.01)

(52) U.S. Cl.
USPC .... 257/355; 257/360; 257/362; 257/E29.012; 361/91.5; 438/286

(58) Field of Classification Search
CPC . H01L 23/60; H01L 27/0259; H01L 27/0266; H01L 27/0248; H01L 27/0251; H02H 9/046
USPC ......... 257/355, 356, 357, 358, 359, 360, 361, 257/362, 363, E29.012; 361/91.5; 438/286
See application file for complete search history.

(56) References Cited

U.S. PATENT DOCUMENTS

| | | | |
|---|---|---|---|
| 3,436,667 A | 4/1969 | Leonard | |
| 4,633,283 A | 12/1986 | Avery | |
| 5,061,652 A | 10/1991 | Bendernagel et al. | |
| 5,276,582 A | 1/1994 | Merrill et al. | |
| 5,341,005 A | 8/1994 | Canclini | |

(Continued)

FOREIGN PATENT DOCUMENTS

| DE | 10 2007 040 875 A1 | 3/2009 |
|---|---|---|
| EP | 0 168 678 A2 | 1/1986 |

(Continued)

OTHER PUBLICATIONS

International Search Report and Written Opinion of the International Search Authority in PCT/US2013/03047, dated Jun. 27, 2013, 9 pages.

(Continued)

*Primary Examiner* — Jerome Jackson, Jr.
*Assistant Examiner* — Paul Budd
(74) *Attorney, Agent, or Firm* — Knobbe, Martens, Olson & Bear, LLP

(57) ABSTRACT

Bi-directional blocking voltage protection devices and methods of forming the same are disclosed. In one embodiment, a protection device includes an n-well and first and second p-wells disposed on opposite sides of the n-well. The first p-well includes a first P+ region and a first N+ region and the second p-well includes a second P+ region and second N+ region. The device further includes a third P+ region disposed along a boundary of the n-well and the first p-well and a fourth P+ region disposed along a boundary of the n-well and the second p-well. A first gate is disposed between the first N+ region and the third P+ region and a second gate is disposed between the second N+ region and the fourth P+ region. The device provides bi-directional blocking voltage protection during high energy stress events, including in applications operating at very low to medium swing voltages.

26 Claims, 20 Drawing Sheets

(56) References Cited

U.S. PATENT DOCUMENTS

| | | | |
|---|---|---|---|
| 5,343,053 A | 8/1994 | Avery |
| 5,652,689 A | 7/1997 | Yuan |
| 5,663,860 A | 9/1997 | Swonger |
| 5,742,084 A | 4/1998 | Yu |
| 5,781,389 A | 7/1998 | Fukuzako et al. |
| 5,889,644 A | 3/1999 | Schoenfeld et al. |
| 5,895,940 A | 4/1999 | Kim |
| 5,998,813 A | 12/1999 | Bernier |
| 6,137,140 A | 10/2000 | Efland et al. |
| 6,144,542 A | 11/2000 | Ker et al. |
| 6,236,087 B1 | 5/2001 | Daly et al. |
| 6,258,634 B1 | 7/2001 | Wang et al. |
| 6,310,379 B1 | 10/2001 | Andresen et al. |
| 6,329,694 B1 | 12/2001 | Lee et al. |
| 6,404,261 B1 | 6/2002 | Grover et al. |
| 6,423,987 B1 | 7/2002 | Constapel et al. |
| 6,512,662 B1 | 1/2003 | Wang |
| 6,590,273 B2 | 7/2003 | Okawa et al. |
| 6,665,160 B2 | 12/2003 | Lin et al. |
| 6,667,870 B1 | 12/2003 | Segervall |
| 6,704,180 B2 | 3/2004 | Tyler et al. |
| 6,724,603 B2 | 4/2004 | Miller et al. |
| 6,756,834 B1 | 6/2004 | Tong et al. |
| 6,768,616 B2 | 7/2004 | Mergens et al. |
| 6,870,202 B2 | 3/2005 | Oka |
| 6,960,792 B1 | 11/2005 | Nguyen |
| 7,034,363 B2 | 4/2006 | Chen |
| 7,038,280 B2 | 5/2006 | Righter |
| 7,071,528 B2 | 7/2006 | Ker et al. |
| 7,232,705 B2 | 6/2007 | Righter |
| 7,232,711 B2 | 6/2007 | Gambino et al. |
| 7,335,543 B2 | 2/2008 | Chen et al. |
| 7,345,341 B2 | 3/2008 | Lin et al. |
| 7,385,793 B1 | 6/2008 | Ansel et al. |
| 7,436,640 B2 | 10/2008 | Su et al. |
| 7,566,914 B2 | 7/2009 | Salcedo et al. |
| 7,601,991 B2 | 10/2009 | Salcedo et al. |
| 7,714,357 B2 | 5/2010 | Hayashi et al. |
| 7,834,378 B2 | 11/2010 | Ryu et al. |
| 7,910,999 B2 | 3/2011 | Lee et al. |
| 7,969,006 B2 | 6/2011 | Lin et al. |
| 8,044,457 B2 | 10/2011 | Salcedo et al. |
| 8,198,651 B2 | 6/2012 | Langguth et al. |
| 8,222,698 B2 | 7/2012 | Salcedo et al. |
| 8,368,116 B2 | 2/2013 | Salcedo et al. |
| 8,432,651 B2 | 4/2013 | Salcedo et al. |
| 8,466,489 B2 | 6/2013 | Salcedo et al. |
| 2001/0040254 A1 | 11/2001 | Takiguchi |
| 2002/0021538 A1 | 2/2002 | Chen et al. |
| 2002/0109190 A1 | 8/2002 | Ker et al. |
| 2002/0122280 A1 | 9/2002 | Ker et al. |
| 2002/0187601 A1 | 12/2002 | Lee et al. |
| 2003/0076636 A1 | 4/2003 | Ker et al. |
| 2004/0135229 A1 | 7/2004 | Sasahara |
| 2004/0164354 A1 | 8/2004 | Mergens et al. |
| 2004/0190208 A1 | 9/2004 | Levit |
| 2004/0207021 A1 | 10/2004 | Russ et al. |
| 2004/0240128 A1 | 12/2004 | Boselli et al. |
| 2005/0012155 A1 | 1/2005 | Ker et al. |
| 2005/0082618 A1 | 4/2005 | Wu et al. |
| 2005/0087807 A1 | 4/2005 | Righter |
| 2005/0088794 A1 | 4/2005 | Boerstler et al. |
| 2005/0093069 A1 | 5/2005 | Logie |
| 2005/0151160 A1 | 7/2005 | Salcedo et al. |
| 2006/0033163 A1 | 2/2006 | Chen |
| 2006/0109595 A1 | 5/2006 | Watanabe et al. |
| 2006/0145260 A1 | 7/2006 | Kim |
| 2006/0186467 A1 | 8/2006 | Pendharkar et al. |
| 2007/0007545 A1 | 1/2007 | Salcedo et al. |
| 2007/0158748 A1 | 7/2007 | Chu et al. |
| 2008/0044955 A1 | 2/2008 | Salcedo et al. |
| 2008/0067601 A1 | 3/2008 | Chen |
| 2009/0032838 A1* | 2/2009 | Tseng et al. ............ 257/133 |
| 2009/0034137 A1* | 2/2009 | Disney et al. ............ 361/56 |
| 2009/0045457 A1 | 2/2009 | Bobde |
| 2009/0206376 A1 | 8/2009 | Mita et al. |
| 2009/0230426 A1 | 9/2009 | Carpenter et al. |
| 2009/0236631 A1 | 9/2009 | Chen et al. |
| 2009/0309128 A1 | 12/2009 | Salcedo et al. |
| 2010/0133583 A1 | 6/2010 | Mawatari et al. |
| 2010/0163973 A1 | 7/2010 | Nakamura et al. |
| 2010/0327343 A1 | 12/2010 | Salcedo et al. |
| 2011/0101444 A1 | 5/2011 | Coyne et al. |
| 2011/0110004 A1 | 5/2011 | Maier |
| 2011/0176244 A1 | 7/2011 | Gendron et al. |
| 2011/0284922 A1 | 11/2011 | Salcedo et al. |
| 2011/0303947 A1 | 12/2011 | Salcedo et al. |
| 2011/0304944 A1 | 12/2011 | Salcedo et al. |
| 2012/0007207 A1 | 1/2012 | Salcedo |
| 2012/0008242 A1 | 1/2012 | Salcedo |
| 2012/0199874 A1 | 8/2012 | Salcedo et al. |
| 2012/0205714 A1 | 8/2012 | Salcedo et al. |
| 2012/0293904 A1 | 11/2012 | Salcedo et al. |
| 2013/0032882 A1 | 2/2013 | Salcedo et al. |
| 2013/0208385 A1 | 8/2013 | Salcedo et al. |
| 2013/0242448 A1 | 9/2013 | Salcedo |
| 2013/0270605 A1 | 10/2013 | Salcedo et al. |

FOREIGN PATENT DOCUMENTS

| | | |
|---|---|---|
| EP | 1 703 560 A2 | 9/2006 |
| KR | 10-2006-0067100 | 6/2006 |
| KR | 10-2009-0123683 | 12/2009 |
| KR | 10-2010-0003569 | 1/2010 |

OTHER PUBLICATIONS

Salcedo et al., *Bidirectional Devices for Automative-Grade Electrostatic Discharge Applications*, IEEE Electron Device Letters, vol. 33, No. 6, Jun. 2012, 3 pages.

Salcedo et al., *On-Chip Protection for Automotive Integrated Circuits Robustness*, IEEE 2012 8th International Caribbean Conference on Devices, Circuits and Systems (ICCDCS), 5 pages (2012).

Anderson et al., *ESD Protection under Wire Bonding Pads*, EOS/ESD Symposium 99-88, pp. 2A.4.1-2A.4.7 (1999).

Luh et al. *A Zener-Diode-Activated ESD Protection Circuit for Sub-Micron CMOS Processes*, Circuits and Systems, IEEE International Symposium, May 28-31, 2000, Geneva, Switzerland, 4 pages.

Salcedo et al., Electrostatic Discharge Protection Framework for Mixed-Signal High Voltage CMOS Applications, IEEE Xplore, downloaded Feb. 23, 2010 at 12:53 EST.

* cited by examiner

BI-DIRECTIONAL BLOCKING VOLTAGE PROTECTION DEVICES AND METHODS OF FORMING THE SAME

BACKGROUND

1. Field

Embodiments of the invention relate to electronic systems, and more particularly, to bi-directional blocking voltage protection devices for integrated electronic systems.

2. Description of the Related Technology

Certain electronic systems can be exposed to a transient signal event, or an electrical signal of a relatively short duration having rapidly changing voltage and high power. Transient signal events can include, for example, electrostatic discharge (ESD) events arising from the abrupt release of charge from an object or person to an electronic system.

Transient signal events can damage integrated circuits (ICs) inside an electronic system due to overvoltage conditions and/or high levels of power dissipation over relatively small areas of the ICs. High power dissipation can increase IC temperature, and can lead to numerous problems, such as gate oxide punch-through, junction damage, metal damage, and surface charge accumulation. Moreover, transient signal events can induce latch-up (in other words, inadvertent creation of a low-impedance path), thereby disrupting the functioning of the IC and potentially causing permanent damage to the IC. Thus, there is a need to provide an IC with protection from such transient signal events.

FIG. 1 is a schematic block diagram of a conventional electronic system 1. The electronic system 1 includes a pin 2, an internal circuit 3, a resistor 4, a protection circuit 5, and a supply clamp 8. The internal circuit 3, the protection circuit 5, and the supply clamp 8 are each electrically coupled between a first supply voltage $V_1$ and a second supply voltage $V_2$, which can be power-low and power-high supplies, respectively. The resistor 4 is disposed in series between the pin 2 and the internal circuit 3, and the protection circuit 5 is electrically coupled between the pin 2 and the first supply voltage $V_1$. The protection circuit 5 includes a first diode 6 and a second diode 7. The first diode 6 includes an anode electrically connected to the pin 2 and a cathode electrically connected to a cathode of the second diode 7. The second diode 7 further includes an anode electrically connected to the first supply voltage $V_1$.

The protection circuit 5 can be used for protecting the pin 2 from a transient electrical event 9. However, the protection afforded by the protection circuit 5 can be limited for certain applications of the electronic system 1. For example, the protection circuit 5 may not be able to provide bi-directional protection to the pad 2 at low voltage levels, since it may not be feasible to configure the first and second diodes 6, 7 to have a relatively low breakdown voltage. Furthermore, even if the breakdown voltage of the first and second diodes 6, 7 can be reduced to a voltage level sufficient for the application, the first and second diodes 6, 7 can have a relatively large size and occupy a relatively large die area, which can affect production cost, capacitive loading on the pad 2, and/or signal integrity in high performance low noise applications.

SUMMARY

In one embodiment, an apparatus for enabling protection from transient electrical events is provided. The apparatus includes a substrate and a first pad and a second pad disposed over the substrate. The substrate includes a first well, a second well, and a third well. The first well has a doping of a first type, and the second and third wells have a doping of a second type opposite to the first type. The second well is disposed on a first side of the first well, and the third well is disposed on a second side of the first well opposite the first side. The substrate further includes a first active region, a second active region, a third active region, a fourth active region, a fifth active region, and a sixth active region. The first and second active regions have a doping of the second type, and the fifth and sixth active regions have a doping of the first type. The first and fifth active regions are disposed in the second well and are electrically coupled to the first pad, and the second and sixth active regions are disposed in the third well and are electrically coupled to the second pad. The third active region is disposed along a boundary of the first and second wells and the fourth active region is disposed along a boundary of the first and third wells. The apparatus further comprises a first implant blocking structure and a second implant blocking structure. The first implant blocking structure is disposed between the third and fifth active regions and the second implant blocking structure is disposed between the fourth and sixth active regions. The second well, the first well, and the third well are configured to operate as an emitter/collector, a base, and a collector/emitter of a bi directional bipolar transistor, respectively, such that the apparatus is configured to provide bi directional blocking protection from a transient electrical event received between the first and second pads.

In another embodiment, an apparatus for enabling protection from transient electrical events is provided. The apparatus includes a substrate and a first pad and a second pad disposed over the substrate. The substrate includes a first well, a second well, and a third well. The first well has a doping of a first type, and the second and third wells have a doping of a second type opposite to the first type. The second well is disposed on a first side of the first well, and the third well is disposed on a second side of the first well opposite the first side. The substrate further includes a first active region, a second active region, a third active region, a fourth active region, a fifth active region, and a sixth active region. The first and second active regions have a doping of the second type, and the fifth and sixth active regions have a doping of the first type. The first and fifth active regions are disposed in the second well and are electrically coupled to the first pad. The second and sixth active regions are disposed in the third well and are electrically coupled to the second pad. The third active region is disposed along a boundary of the first and second wells and the fourth active region is disposed along a boundary of the first and third wells. The apparatus further includes a first means for implant blocking and a second means for implant blocking. The first implant blocking means is disposed between the third and fifth active regions and the second implant blocking means is disposed between the fourth and sixth active regions. The second well, the first well, and the third well are configured to operate as an emitter/collector, a base, and a collector/emitter of a bi directional bipolar transistor, respectively, such that the apparatus is configured to provide bi directional blocking protection from a transient electrical event received between the first and second pads. In some implementations, the first and second implant blocking means are configured to provide fast conductivity control.

In another embodiment, a method of enabling protection from transient electrical events is provided. The method includes forming a first well, a second well, and a third well in a substrate. The first well has a doping of a first type, and the second and third wells have a doping of a second type opposite to the first type. The second well is disposed on a first side of the first well, and the third well is disposed on a second side of the first well opposite the first side. The method further includes forming a first implant blocking structure and a second implant blocking structure. The method further includes forming a first active region, a second active region, a third active region, a fourth active region, a fifth active region, and a sixth active region in the substrate. The first and second active regions have a doping of the second type, and the fifth and sixth active regions have a doping of the first type. The first and fifth active regions are disposed in the second well. The second and sixth active regions are disposed in the third well. The third active region is disposed along a boundary of the first and second wells and the fourth active region is disposed along a boundary of the first and third wells. The third and fifth active regions are disposed on opposite sides of the first implant blocking structure, and the fourth and sixth active regions are disposed on opposite sides of the second implant blocking structure. The method further includes configuring the second well, the first well, and the third well to operate as an emitter/collector, a base, and a collector/emitter of a bi directional bipolar transistor, respectively.

DETAILED DESCRIPTION OF EMBODIMENTS

Figure 1:
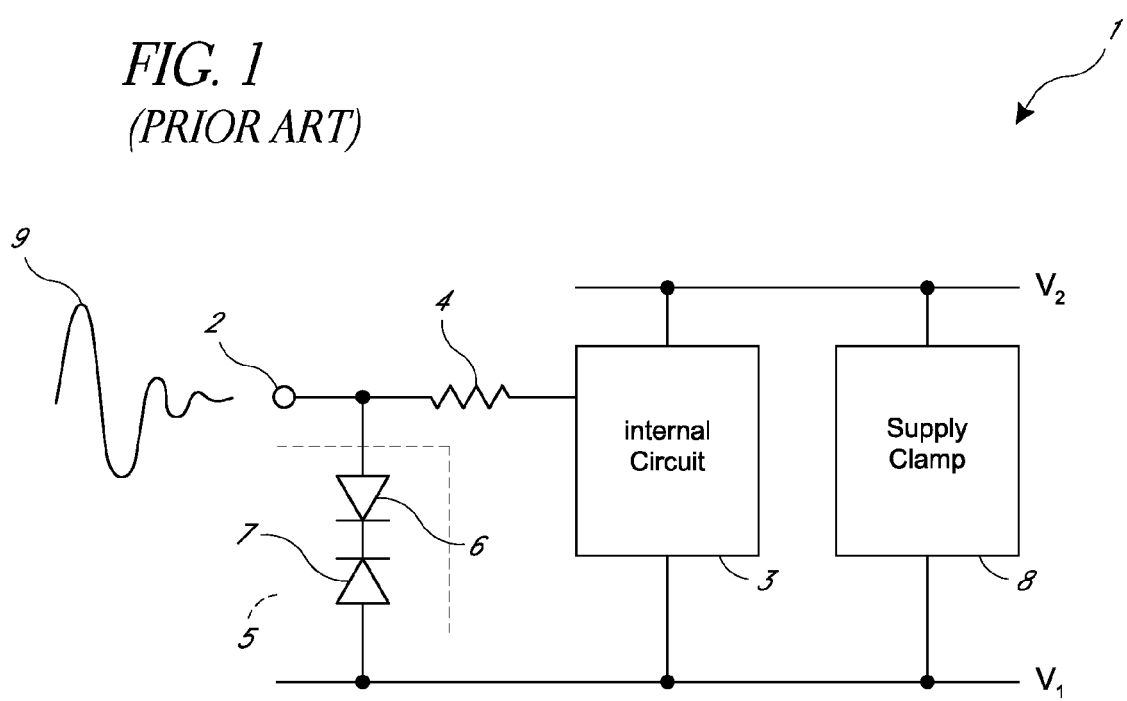
FIG. 1 is a schematic block diagram of a conventional electronic system.

The following detailed description of certain embodiments presents various descriptions of specific embodiments of the invention. However, the invention can be embodied in a multitude of different ways as defined and covered by the claims. In this description, reference is made to the drawings where like reference numerals indicate identical or functionally similar elements.

Terms such as above, below, over and so on as used herein refer to a device orientated as shown in the figures and should be construed accordingly. It should also be appreciated that because regions within a semiconductor device (such as a transistor) are defined by doping different parts of a semiconductor material with differing impurities or differing concentrations of impurities, discrete physical boundaries between different regions may not actually exist in the completed device but instead regions may transition from one to another. Some boundaries as shown in the accompanying figures are of this type and are illustrated as abrupt structures merely for the assistance of the reader. In the embodiments described below, p-type regions can include a p-type semiconductor material, such as boron, as a dopant. Further, n-type regions can include an n-type semiconductor material, such as phosphorous, as a dopant. A skilled artisan will appreciate various concentrations of dopants in regions described below.

Certain electronic systems are configured to protect circuits or components therein from transient electrical events. Furthermore, to assure that an electronic system is reliable, manufacturers can test the electronic system under defined stress conditions, which can be described by standards set by various organizations, such as the Joint Electronic Device Engineering Council (JEDEC), the International Electrotechnical Commission (IEC), and the Automotive Engineering Council (AEC). The standards can cover a wide multitude of transient electrical events as discussed above, including ESD events.

Electronic circuit reliability is enhanced by providing protection devices to the pads of an IC. The protection devices can be incorporated on-chip or at the system-level, and can maintain the voltage level at the pads within a predefined safe range by transitioning from a high-impedance state to a low-impedance state when the voltage of the transient electrical event reaches a trigger voltage. Thereafter, the protection device can shunt at least a portion of the current associated with the transient electrical event before the voltage of a transient electrical event reaches a positive or negative failure voltage that can lead to one of the most common causes of damage to the IC. As will be described in detail later with reference to FIG. 2B, after activation, the protection device can remain in the low-impedance state as long as the transient electrical event voltage level is above a positive holding voltage or below a negative holding voltage.

An integrated circuit (IC) can include one or more pads exposed to an operational voltage that can range between a negative voltage and a positive voltage. In certain applications, it is desirable to have a protection device that can protect an internal circuit from both negative and positive transient signals that have a voltage magnitude that is outside normal circuit operating conditions. For example, it can be desirable that the protection device protect an internal circuit against transient signals that exceed the IC power-high and power-low (for instance, ground) voltage levels. Using a protection device to provide protection against both positive and negative transient electrical events can permit a reduction in layout area relative to a design that uses separate structures for protection against positive and negative transient electrical events, thereby enabling a more scalable design solution for low voltage operation. In addition, there is a need for a protection device that can be fine tuned for different current and voltage (I-V) blocking characteristics and able to render protection against positive and negative transient electrical events with fast operational performance and low static power dissipation at the operating voltage conditions.

Overview of Electronic Systems with Protection Devices

Figure 2A:
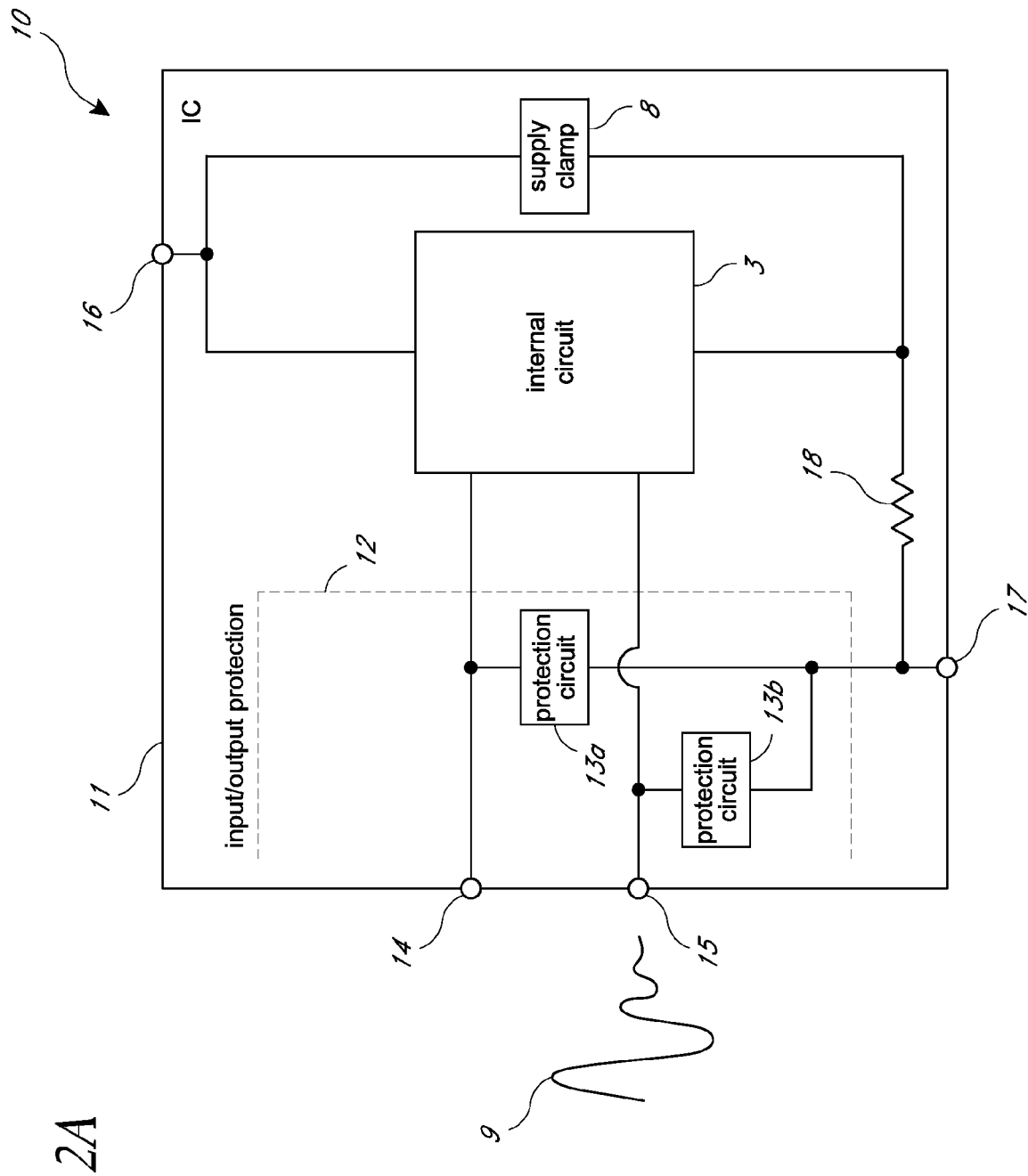
FIG. 2A is a schematic block diagram of one example of an electronic system including an integrated circuit (IC) and an input/output co-design protection system.

FIG. 2A is a schematic block diagram of an electronic system 10, which can include one or more protection devices according to some embodiments. The illustrated electronic system 10 includes an integrated circuit (IC) 11 that includes an input/output protection system 12, an internal circuit 3, a first signal pad or pin 14, a second signal pad 15, a power-high pad or pin 16, a power-low pad or pin 17, a resistor 18, and a supply clamp 8. The internal circuit 3 can be electrically connected to one or more of the pads 14-17. The signal pads 14, 15 can be any suitable pads, including for example, input pads, output pads, and/or bidirectional pads. In certain implementations, the power-low pad 17 is a ground pad. Although only two signal pads, one power-high pad, and one power-low pad are illustrated in FIG. 2A, the IC 11 can include more or fewer signal pads, power-high pads, and/or power-low pads.

The IC 11 can be exposed to transient electrical events, such as ESD events, which can cause IC damage and induce latch-up, such as during a powered-up stress condition. For example, the second signal pad 15 can receive a transient electrical event 9, which can travel along electrical connections of the IC 11 and reach the internal circuit 3. The transient electrical event 9 can produce overvoltage or undervoltage conditions and can dissipate high levels of power, which can disrupt the functioning of the internal circuit 3 and potentially cause permanent damage.

In some embodiments, the input/output protection system 12 can be provided to ensure reliability of the IC 11 by maintaining the voltage level at the pads of the IC 11 within a particular range of voltage, which can vary from pad to pad. The input/output protection system 12 can include one or more protection devices, such as first and second protection devices 13a, 13b. The protection devices 13a, 13b can be configured to divert a current associated with a transient electrical event received on a pad of the IC to other pads of the IC, thereby providing transient electrical event protection, as will be described in further detail below. When no transient electrical event is present, the protection device can remain in a high-impedance/low-leakage state, thereby reducing static power dissipation resulting from leakage current.

In the configuration illustrated in FIG. 2A, the first protection device 13a has been electrically connected between the first signal pad 14 and the power-low pad 17, and the second protection device 13b has been electrically connected between the second signal pad 15 and the power-low pad 17. However, skilled artisans will appreciate that other configurations are possible. For example, in certain implementations, protection devices can be placed, for example, between a power-high pad and a signal pad and/or between a power-high pad and a power-low pad.

The IC 11 can include protection circuitry in addition to the input/output protection system 12. For example, the illustrated IC 11 includes the supply clamp 8, which can be used to maintain the voltage between the power-high pad 16 and the power-low pad 17 within a defined safe range. As shown in FIG. 2A, the resistor 18 has been disposed in a signal path between the power-low pad 17 and the supply clamp 8 and the internal circuit 3. Including the resistor 18 can help prevent latch-up of the internal circuit 3 and/or the supply clamp 8 during power-up testing by reducing majority carrier injection into a substrate used to form the IC 11. Although the IC 11 is illustrated as including the supply clamp 8, in certain implementations, the supply clamp 8 can be omitted.

The input/output protection system 12 can be integrated on-chip with the IC 11. However, in other embodiments, the input/output protection system 12 can be arranged in a separate IC. For example, the input/output protection system 12 can be included in a separately packaged IC, or it can be encapsulated in a common package with the IC 11. In such embodiments, one or more protection devices can be placed in a stand-alone IC, in a common package for system-on-a-package applications, or integrated with an IC in a common semiconductor substrate for system-on-a-chip applications.

The IC 11 can be used in, for example, interface systems, industrial control systems, communication transceiver systems, power management systems, microelectromechanical system (MEMS) sensors, automotive systems, or a variety of other systems. The IC 11 can be utilized in electronic systems in which the pads of the IC are exposed to user contact through a low-impedance connection.

Figure 2B:
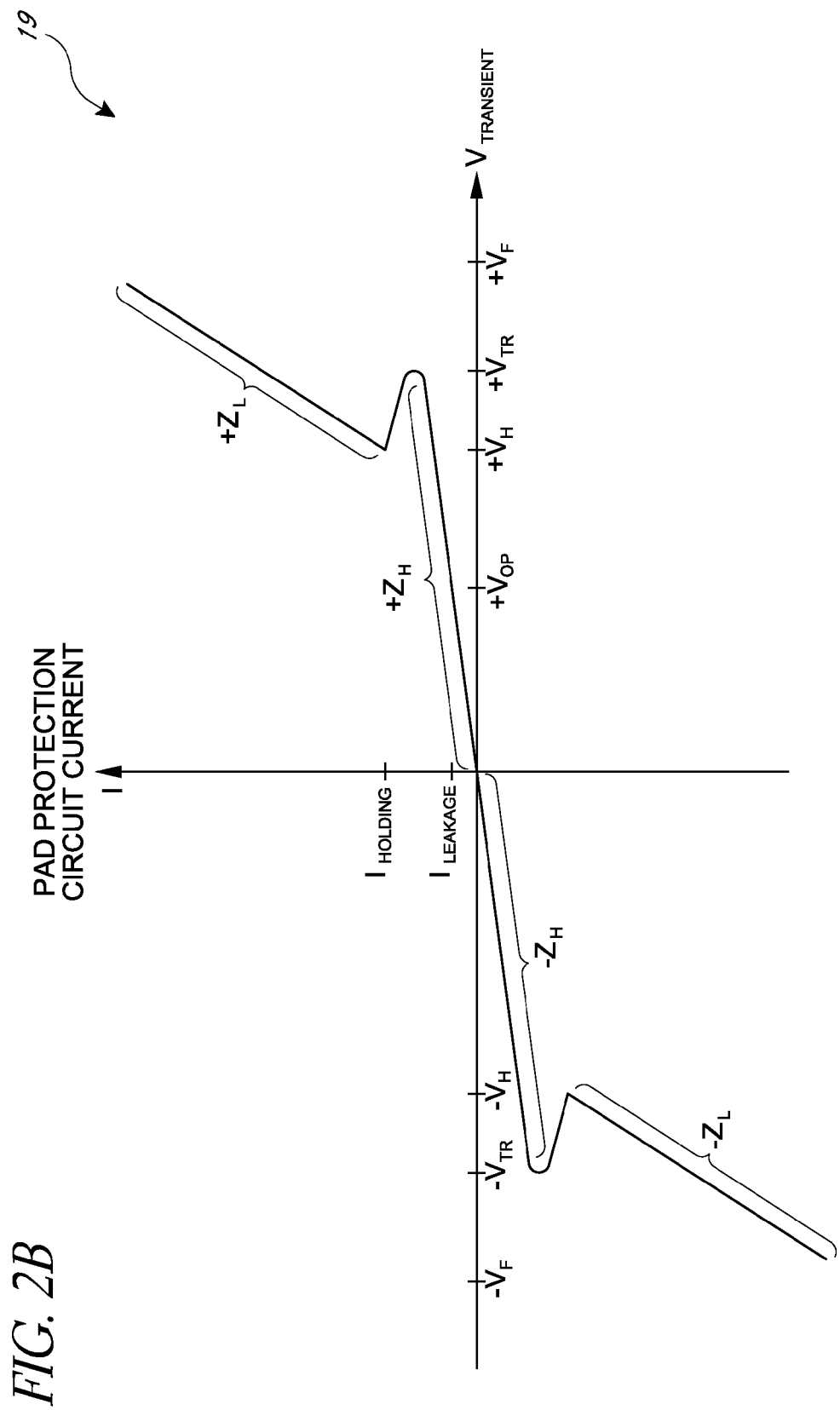
FIG. 2B is a graph showing a relationship between current and voltage of a bi-directional protection device according to one embodiment.

FIG. 2B is a graph 19 showing a relationship between current and voltage of a bi-directional or bi-polar protection device according to one embodiment. As described above, a protection device can be configured to maintain the voltage level at a pad within a predefined safe range. Thus, the protection device can shunt a large portion of the current associated with the transient signal event before the voltage of the transient signal $V_{TRANSIENT}$ reaches either a positive failure voltage $+V_F$ or a negative failure voltage $-V_F$ that would otherwise cause damage to the IC. Additionally, the protection device can conduct a relatively low amount of current at the normal operating voltage $+V_{OP}$, thereby reducing or minimizing static power dissipation resulting from the leakage current $I_{LEAKAGE}$, which enhances the energy efficiency of the IC.

Furthermore, as shown in the graph 19, the protection device can transition from a high-impedance state $+Z_H$ to a low-impedance state $+Z_L$ when the voltage of the transient signal $V_{TRANSIENT}$ reaches a positive trigger voltage $+V_{TR}$. Thereafter, the pad circuit can shunt a large amount of current over a wide range of transient electrical event voltage levels. The pad circuit can remain in the low-impedance state $+Z_L$ as long as the transient signal voltage level is above a positive holding voltage $+V_H$. By configuring the protection device to have a trigger voltage $+V_{TR}$ and a holding voltage $+V_H$, the protection device can have improved performance while having enhanced stability against unintended activation. In certain implementations, it can be specified for the holding voltage $+V_H$ to be above the operating voltage $+V_{OP}$ such that the protection device does not remain in the low-impedance state $+Z_L$ after passage of the transient signal event and a return to normal operating voltage levels. Bi-directional operation of the protection device can be important in a variety of applications, including, for example, applications in which an IC has a very low bi-polar (positive and negative) operating voltage at input/output pads that can be potentially stressed during powered-up conditions.

In the illustrated embodiment, the protection device can also shunt a large amount of current for transient signal events having a negative voltage, so that the protection device can provide transient electrical event protection against both negative and positive transient signals. The protection device can transition from a high-impedance state $-Z_H$ to a low-impedance state $-Z_L$ when the voltage of the transient signal $V_{TRANSIENT}$ reaches a negative trigger voltage $-V_{TR}$, thereby shunting a large negative amount of current. The pad circuit can remain in the low-impedance state $-Z_L$ as long as the voltage magnitude of the negative transient signal is greater than the voltage magnitude of the negative holding voltage $-V_H$.

In FIG. 2B, voltage is expressed along a horizontal axis, and current is expressed along a vertical axis. In the illustrated embodiment, the protection device has I-V characteristics that are symmetrical. In other implementations, the protection devices described herein can have asymmetrical I-V characteristics. For example, protection devices can have different trigger voltages, holding voltages, and/or failure voltages with different I-V curves in the positive and negative regions of the graph.

Figure 2C:
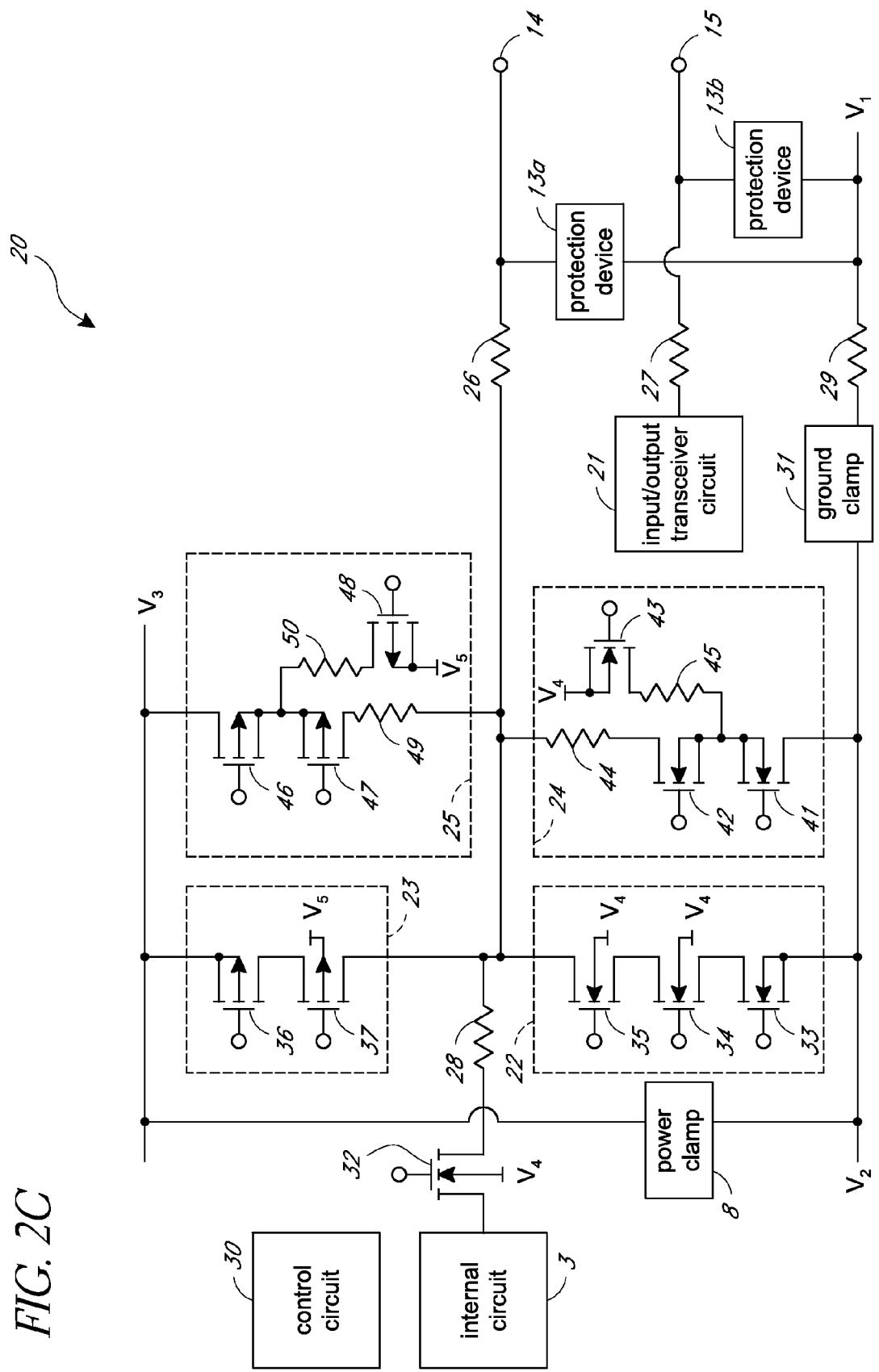
FIG. 2C is a schematic block diagram of an IC including bi-directional protection devices according to some embodiments.

FIG. 2C is a schematic block diagram of an IC 20 including bi-directional protection devices according to some embodiments. The IC 20 includes the internal circuit 3, the first signal pad 14, the second signal pad 15, the power clamp 8, the first and second protection devices 13a, 13b, an input/output transceiver circuit 21, a first output circuit 22, a second output circuit 23, a first arbitration circuit 24, a second arbitration circuit 25, a first resistor 26, a second resistor 27, a third resistor 28, a fourth resistor 29, a control circuit 30, a ground clamp 31, and a first n-type metal oxide semiconductor (NMOS) transistor 32. The illustrated IC 20 can be, for example, an interface IC, such as a half or full duplex communication transceiver IC in which the first and second signal pads 14, 15 are directly exposed to a user in a normal operational environment. As used herein and as persons having ordinary skill in the art will appreciate, MOS transistors can have gates made out of materials that are not metals, such as poly silicon, and can have dielectric regions implemented not just with silicon oxide, but with other dielectrics, such as high-k dielectrics.

The IC 20 can include a plurality of signal lines used for communicating data over an interface. For example, the IC 20 can be configured to communicate using the first and second signal pads 14, 15 using externally connected cables.

The first and second protection devices 13a, 13b have been included to aid in providing protection to the IC 20. For example, the first protection device 13a includes a first end electrically connected to the first signal pad 14 and a second end electrically connected to the first supply voltage $V_1$, which can be, for example, a power-low supply, such as a ground supply. Additionally, the second protection device 13b includes a first end electrically connected to the second signal pad 15 and a second end electrically connected to the first supply voltage $V_1$. In certain implementations, the ground clamp 31 and/or the fourth resistor 29 can be electrically connected between the first supply voltage $V_1$ and a second supply voltage $V_2$ used to provide ground to transistors not associated with the first and second protection devices 13a, 13b. Electrically isolating the first and second supply voltages $V_1$, $V_2$ can serve a variety of functions, including, for example, to help prevent latch-up of the IC 20 during power-up testing by reducing majority carrier injection into a substrate used to form the IC 20.

In certain implementations, the first supply voltage $V_1$ is electrically connected to one or more ground pads and the second supply voltage $V_2$ is electrically connected to one or more different ground pads. The ground clamp 31 can be used to maintain the voltage between the first supply voltage $V_1$ and the second supply voltage $V_2$ within a defined safe range. In one embodiment, the fourth resistor 29 has a resistance in the range of about 0.1Ω and about 1Ω, for example, about 0.5Ω. However, persons having ordinary skill in the art will readily ascertain other suitable resistance values.

The first output circuit 22 and the second output circuit 23 can be used for electrically communicating signals on the first signal pad 14. For example, the first output circuit 22 includes a first end electrically connected to the second supply voltage $V_2$ and a second end electrically connected to the first signal pad 14 through the first resistor 26, and can be used to decrease the voltage of the first signal pad 14, as will be described further below. Additionally, the second output circuit 23 includes a first end electrically connected to the third supply voltage $V_3$ and a second end electrically connected to the first signal pad 14 through the first resistor 26, and can be used to increase the voltage of the first signal pad 14, as will be described further below. In certain implementations, the second supply voltage $V_2$ is electrically connected to one or more power-low pads, such as ground pads, and the third supply voltage $V_3$ is electrically coupled to one or more power-high pads. The first resistor 26 can have any suitable resistance, such as a relatively low resistance selected to be in the range of about 5Ω and about 15Ω, for example, about 10Ω However, persons having ordinary skill in the art will readily ascertain other suitable resistance values, such as resistance values associated with signal processing integrity and/or minimum noise constraints.

The first output circuit 22 includes second to fourth NMOS transistors 33-35. The second NMOS transistor 33 includes a source and body electrically connected to the second supply voltage $V_2$ and a drain electrically connected to a source of the third NMOS transistor 34. The fourth NMOS transistor 35 includes a source electrically connected to a drain of the third NMOS transistor 34 and a drain electrically connected to the first signal pad 14 through the first resistor 26. The third NMOS transistor 34 and the fourth NMOS transistor 35 each further include a body electrically connected to a fourth supply voltage $V_4$. In certain implementations, the fourth supply voltage $V_4$ is selected to be a voltage below the second supply voltage $V_2$, and can have a magnitude selected to help achieve the target signaling performance of the IC 20. For example, the signaling conditions on the first signal pad may include positive and negative voltage signaling levels, and the fourth supply voltage $V_4$ can be used to prevent the bodies of the third and fourth NMOS transistor 34, 35 from becoming forward-biased when the first signal pad 14 has a relatively low voltage level. In one implementation, the voltage on the first signal pad 14 ranges between about −1 V and about 3.4 V during normal operation.

The second to fourth NMOS transistors 33-35 each further include a gate that can be controlled using the control circuit 30. In certain implementations, the gate of the second NMOS transistor 33 is controlled to a voltage level corresponding to a desired sink current of the first output circuit 22, the gate of the third NMOS transistor 34 is controlled to a voltage level corresponding to a desired resistance of the third NMOS transistor 34 so as to boost the output impedance of the first output circuit 22, and the gate of the fourth NMOS transistor 35 is used to turn the first output circuit 22 on and off to generate a signal on the first signal pad 14.

The second output circuit 23 includes first and second p-type metal oxide semiconductor (PMOS) transistors 36, 37. The first PMOS transistor 36 includes a source and a body electrically connected to the third supply voltage $V_3$ and a drain electrically connected to a source of the second PMOS transistor 37. The second PMOS transistor 37 further includes a drain electrically connected to the first signal pad 14 through the first resistor 26. The second PMOS transistor 37 further includes a body electrically connected to a fifth supply voltage $V_5$. In certain implementations, the fifth supply voltage $V_5$ is selected to be a voltage above the third supply voltage $V_3$, and can have a magnitude selected to help prevent the body of the second PMOS transistor 37 from becoming forward-biased when the voltage of the first signal pad 14 increases above the third supply voltage $V_3$. The first and second PMOS transistors 36, 37 each include a gate that can be controlled using the control circuit 30. In certain implementations, the gate of the first PMOS transistor 36 is controlled to a voltage level corresponding to a desired source current of the second output circuit 23 and the gate of the second PMOS transistor 37 is used to turn the second output circuit 23 on and off to generate a signal on the first signal pad 14.

The internal circuit 3 and the first NMOS transistor 32 can be used to sense signals received on the first signal pad 14. For example, the first NMOS transistor 32 includes a drain electrically connected to the internal circuit 3 and a source electrically connected to the first signal pad 14 through the first and third resistors 26, 28. The first NMOS transistor 32 can be used to control the impedance between the internal circuit 3 and the first signal pad 14, thereby allowing a voltage level on the first signal pad 14 to be sensed by the internal circuit 3. For example, the control circuit 30 can be used to control the potential of the gate of the first NMOS transistor 32 to a level suitable for the internal circuit 3 to sense a signal received on the first signal pad 14. As illustrated in FIG. 2C, the first NMOS transistor 32 can include a body electrically connected to the fourth potential $V_4$.

In certain implementations, the first and second arbitration circuits 24, 25 can be included to generate the fourth and fifth supply voltages $V_4$, $V_5$, respectively. For example, the first arbitration circuit 24 can be configured to generate the fourth supply voltage $V_4$ such that the supply has a voltage level equal to about the lesser of the second supply voltage $V_2$ and the voltage of the first signal pad 14. Additionally, the second arbitration circuit 25 can be configured to generate the fifth supply voltage $V_5$ such that the supply has a voltage level equal to about the greater of the third supply voltage $V_3$ and the voltage of the first signal pad 14. Inclusion of the first and second arbitration circuits 24, 25 can aid in permitting the voltage at the first signal pad 14 to fall below the second supply voltage $V_2$ and to increase above the third supply voltage $V_3$ during signaling.

The first arbitration circuit 24 includes a fifth NMOS transistor 41, a sixth NMOS transistor 42, a seventh NMOS transistor 43, a fifth resistor 44, and a sixth resistor 45. The fifth NMOS transistor 41 includes a drain electrically connected to the second supply voltage $V_2$ and a source and body electrically connected to a source and body of the sixth NMOS transistor 42 and to a first end of the sixth resistor 45. The sixth resistor 45 further includes a second end electrically connected to a drain of the seventh NMOS transistor 43. The seventh NMOS transistor 43 further includes a source and a body electrically connected to the fourth supply voltage $V_4$.

The fifth resistor 44 includes a first end electrically connected to a drain of the sixth NMOS transistor 42 and a second end electrically connected to the first signal pad 14 through the first resistor 26. The fifth to seventh NMOS transistors 41-43 each further include a gate, which can be controlled using, for example, the control circuit 30.

The second arbitration circuit 25 includes a third PMOS transistor 46, a fourth PMOS transistor 47, a fifth PMOS transistor 48, a seventh resistor 49, and an eighth resistor 50. The third PMOS transistor 46 includes a drain electrically connected to the third supply voltage $V_3$ and a source and body electrically connected to a source and body of the fourth PMOS transistor 47 and to a first end of the eighth resistor 50. The eighth resistor 50 further includes a second end electrically connected to a drain of the fifth PMOS transistor 48. The fifth PMOS transistor 48 further includes a source and a body electrically connected to the fifth supply voltage $V_5$. The third to fifth PMOS transistors 46-48 each further include a gate, which can be controlled using, for example, the control circuit 30. The seventh resistor 49 includes a first end electrically connected to a drain of the fourth PMOS transistor 47 and a second end electrically connected to the first signal pad 14 through the first resistor 26.

When a transient electrical event is received on the first signal pad 14, the voltage of the first signal pad 14 can increase until a trigger voltage of the first protection device 13a is reached (see FIG. 2B). However, in certain implementations, there can be an overshoot of voltage on the first signal pad 14 before the first protection device 13a activates.

In one embodiment, the first and second arbitration circuits 24, 25 and the first and second output circuits 22, 23 are configured to have a trigger voltage greater than an overshoot voltage of the first protection device 13a to aid in preventing the arbitration circuits 24, 25 and/or the output circuits 22, 23 from breaking down before the first protection device 13a activates during a transient electrical event. In one implementation, at least two p-n junctions are disposed in each electrical path between the first signal pad 14 and the second supply voltage $V_2$. Configuring the core circuitry of the IC 20 in this manner can prevent a parasitic path between the first signal pad 14 and the second supply voltage $V_2$ from activating before the first protection device 13a turns on during the high energy transient electrical event. As shown in FIG. 2C, at least two p-n junctions can be provided between the first signal pad 14 and the second supply voltage $V_2$ by cascading MOS transistor devices. In certain implementations, the power clamp 8 can include a p-n junction, and the second output circuit 23 can include a fewer number of devices in a cascade than the first output circuit 22.

The fifth and seventh resistors 44, 49 can be included in the first and second arbitration circuits 24, 25, respectively, to aid in increasing the impedance in parasitic electrical paths between the first signal pad 14 and the second supply voltage $V_2$ through the first and second arbitration circuits 24, 25. In one implementation, the fifth and seventh resistors 44, 49 each have a resistance selected to be in the range of about 30Ω and about 85Ω, for example, about 72Ω. However, persons having ordinary skill in the art will readily ascertain other suitable resistance values.

The sixth and eighth resistors 45, 50 can also aid in increasing the impedance in parasitic paths between the first signal pad 14 and the second supply voltage $V_2$ through the first and second arbitration circuits 24, 25, as well as to aid the first and second arbitration circuits 24, 25 in generating the fourth and fifth supply voltages $V_4$, $V_5$, respectively. In certain implementations, the sixth and eighth resistors 45, 50 each have a resistance selected to be in the range of about 30Ω and about 85Ω, for example, about 75Ω. However, persons having ordinary skill in the art will readily ascertain other suitable resistance values.

The second signal pad 15 is electrically connected to the input/output processing circuit 21 through the second resistor 27. For example, the second resistor 27 includes a first end electrically connected to the second signal pad 15 and a second end electrically connected to the input/output processing circuit 21. In certain implementations, the input/output processing circuit 21 includes circuitry similar to that shown electrically connected to the first signal pad 14. However, input/output processing circuit 21 need not be the same as the circuitry shown electrically connected to the first signal pad 14. In certain implementations, the second resistor 27 has a resistance selected to be in the range of about 5Ω and about 15Ω, for example, about 10Ω. However, persons having ordinary skill in the art will readily ascertain other suitable resistance values.

Although the protection devices 13a, 13b have been illustrated in the context of a transceiver IC, the protection devices described herein can be used in a wide range of ICs and other electronics.

Overview of Bi-Directional Protection Devices

Figure 3:
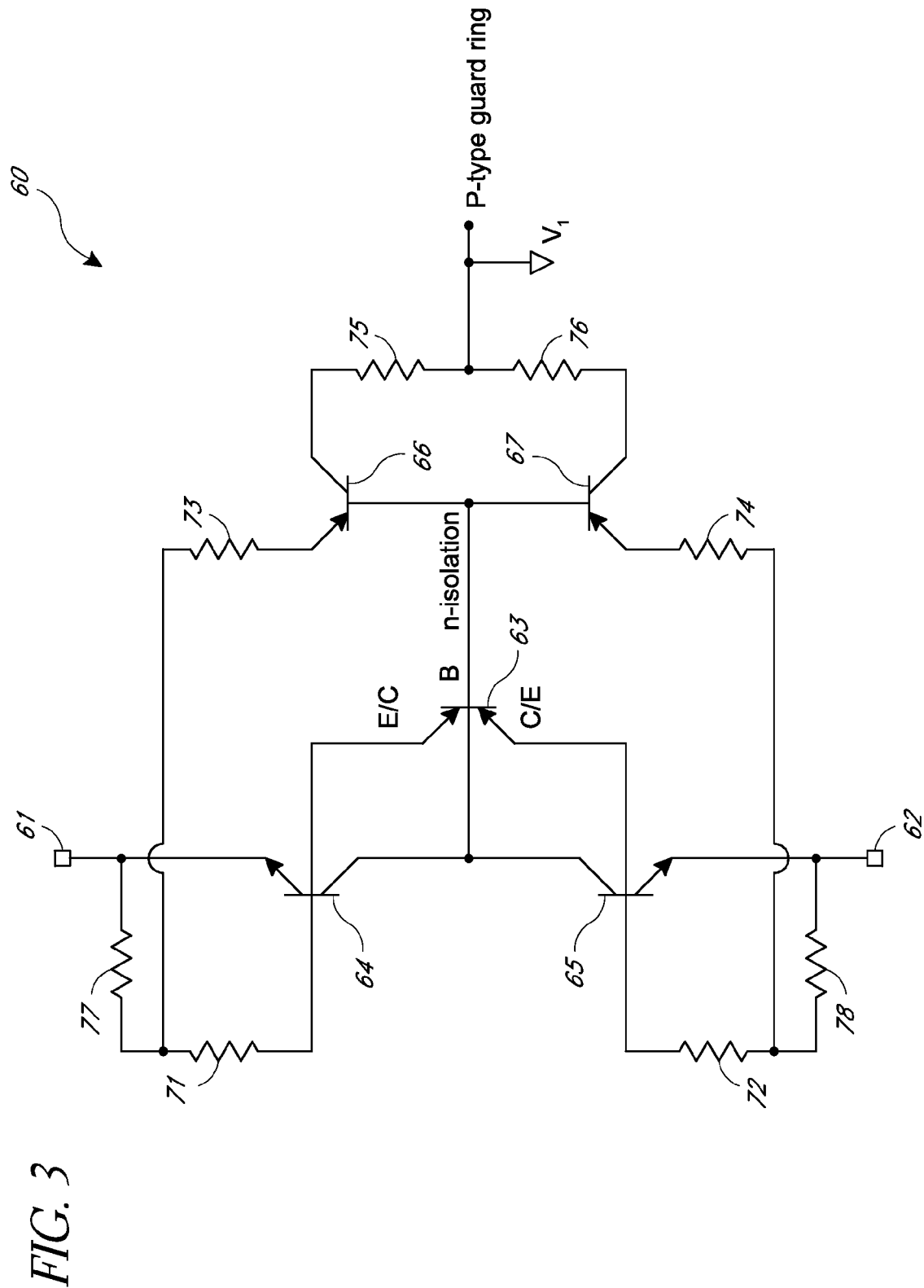
FIG. 3 is a circuit diagram illustrating a bi-directional protection circuit according to one embodiment.

FIG. 3 is a circuit diagram illustrating a bi-directional protection circuit 60 according to one embodiment. The illustrated protection circuit 60 is electrically connected between a first pad 61 and a second pad 62, and can be used to, for example, provide low bi-directional blocking voltage protection. The bi-directional protection circuit 60 includes a bi-directional bipolar transistor 63, first and second NPN bipolar transistors 64, 65, first and second PNP bipolar transistors 66, 67, and first to eighth resistors 71-78. The protection circuit 60 can be adapted to serve, for example, any of the protection devices 13a, 13b of FIGS. 2A and 2C.

The protection circuit 60 can be electrically coupled between the first and second pads 61, 62 such that a current shunt path can be established between the pads when there is an overvoltage or undervoltage condition. For example, the first pad can be a signal pad of an IC, such as the first and second signal pads 14, 15 of FIG. 2A, and the second pad can be a power-low pad, such as the power-low pad 17 of FIG. 2A. The protection circuit 60 can provide a low-impedance path between the signal pad and the power-low pad during a transient electrical event. In certain implementations, the second pad 62 is a ground pad.

The first NPN bipolar transistor 64 includes an emitter electrically connected to a first end of the seventh resistor 77 and to the first pad 61. The first NPN bipolar transistor 64 further includes a base electrically connected to an emitter/collector E/C of the bi-directional bipolar transistor 63 and to a first end of the first resistor 71. The first resistor 71 further includes a second end electrically connected to a second end of the seventh resistor 77 and to a first end of the third resistor 73. The second NPN bipolar transistor 65 includes an emitter electrically connected to a first end of the eighth resistor 78 and to the second pad 62. The second NPN bipolar transistor 65 further includes a base electrically connected to a collector/emitter C/E of the bi-directional bipolar transistor 63 and to a first end of the second resistor 72. The second resistor 72 further includes a second end electrically connected to a second end of the eighth resistor 78 and to a first end of the fourth resistor 74. The bi-directional bipolar transistor 63 further includes a base electrically connected to a collector of the first NPN bipolar transistor 64, to a collector of the second NPN bipolar transistor 65, to a base of the first PNP bipolar transistor 66, and to a base of the second PNP bipolar transistor 67. In certain implementations, the base of the bi-directional bipolar transistor 63 is formed from an n-well that is electrically connected to a floating n-type isolation layer. The first PNP bipolar transistor 66 further includes an emitter electrically connected to a second end of the third resistor 73 and a collector electrically connected to a first end of the fifth resistor 75. The second PNP bipolar transistor 67 further includes an emitter electrically connected to a first end of the fourth resistor 74 and a collector electrically connected to a first end of the sixth resistor 76. The sixth resistor 76 further includes a second end electrically connected to a second end of the fifth resistor 75 and to the first supply voltage $V_1$, which can be, for example, a ground node. In certain implementations, the second ends of the fifth and sixth resistors 75, 76 are electrically connected to a p-type guard ring.

The bi-directional bipolar transistor 63 can operate bi-directionally, and an operation of the emitter/collector E/C and the collector/emitter C/E as emitter and collector can depend on the voltage conditions of the first and second pads 61, 62. For example, when a voltage difference between the first pad 61 and the second pad 62 is greater than about a positive trigger voltage $+V_{TR}$ (see FIG. 2B) of the protection circuit 60, the emitter/collector E/C of the bi-directional bipolar transistor 63 serves as an emitter and the collector/emitter C/E of the bi-directional bipolar transistor serves as a collector. In contrast, when a voltage difference between the first pad 61 and the second pad 62 is less than about a negative trigger voltage $-V_{TR}$ (see FIG. 2B) of the protection circuit 60, the emitter/collector E/C of the bi-directional bipolar transistor 63 serves as a collector and the collector/emitter C/E of the bi-directional bipolar transistor 63 serves as an emitter.

In certain implementations, the bi-directional bipolar transistor 63 can be a PNP bipolar transistor configured to control the response and current discharge of the protection circuit 60 during an overvoltage or undervoltage condition. For example, the first and second NPN bipolar transistors 64, 65 can be configured to have limited injection efficiency at their emitter-base junctions, thereby allowing the bi-directional bipolar transistor 63 to substantially control the response characteristic.

The first to sixth resistors 71-76 can be formed using, for example, the resistivity of doped regions to achieve the target resistances. For example, in one embodiment, the first to sixth resistors 71-76 are implemented by using the resistivity of n-type or p-type wells desired to achieve a turn-on speed and stability desired for a particular application. For example, the resistance of the first and second resistors 71, 72 can be selected to obtain a desired build-up to forward-bias the emitter-base junctions of the first and second NPN bipolar transistors 64, 65, respectively. In one implementation, the first and second resistors 71, 72 each have a resistance selected to be in the range of about 0.25Ω and about 8Ω, for example, about 2Ω, the third and fourth resistors 73, 74 each have a resistance selected to be in the range of about 15Ω and about 45Ω, for example, about 20Ω, and the fifth and sixth resistors 75, 76 each have a resistance selected to be in the range of about 15Ω and about 40Ω, for example, about 30Ω. However, persons having ordinary skill in the art will readily ascertain other suitable resistance values.

In certain implementations, the resistance between the base-emitter junctions of the first and second NPN bipolar transistors 64, 65 is enhanced by including additional resistor components. For example, as shown in FIG. 3, the seventh and eighth resistors 77, 78 can be electrically connected in series with the first and second resistors 71, 72, respectively, to aid in increasing the resistance between the base-emitter junctions of the first and second NPN bipolar transistors 64, 65. In one embodiment, the seventh and eight resistors 77, 78 comprise polysilicon resistors disposed above a surface of a substrate in which the bipolar transistors 63-67 and resistors 71-76 are formed. In one implementation, the seventh and eighth resistors 77, 78 each have a resistance selected to be in the range of about 0.2Ω and about 200Ω, for example, about 0.5Ω. However, persons having ordinary skill in the art will readily ascertain other suitable resistance values, including, for example, resistance values selected to reduce the trigger voltage of the protection circuit.

Figure 4A:
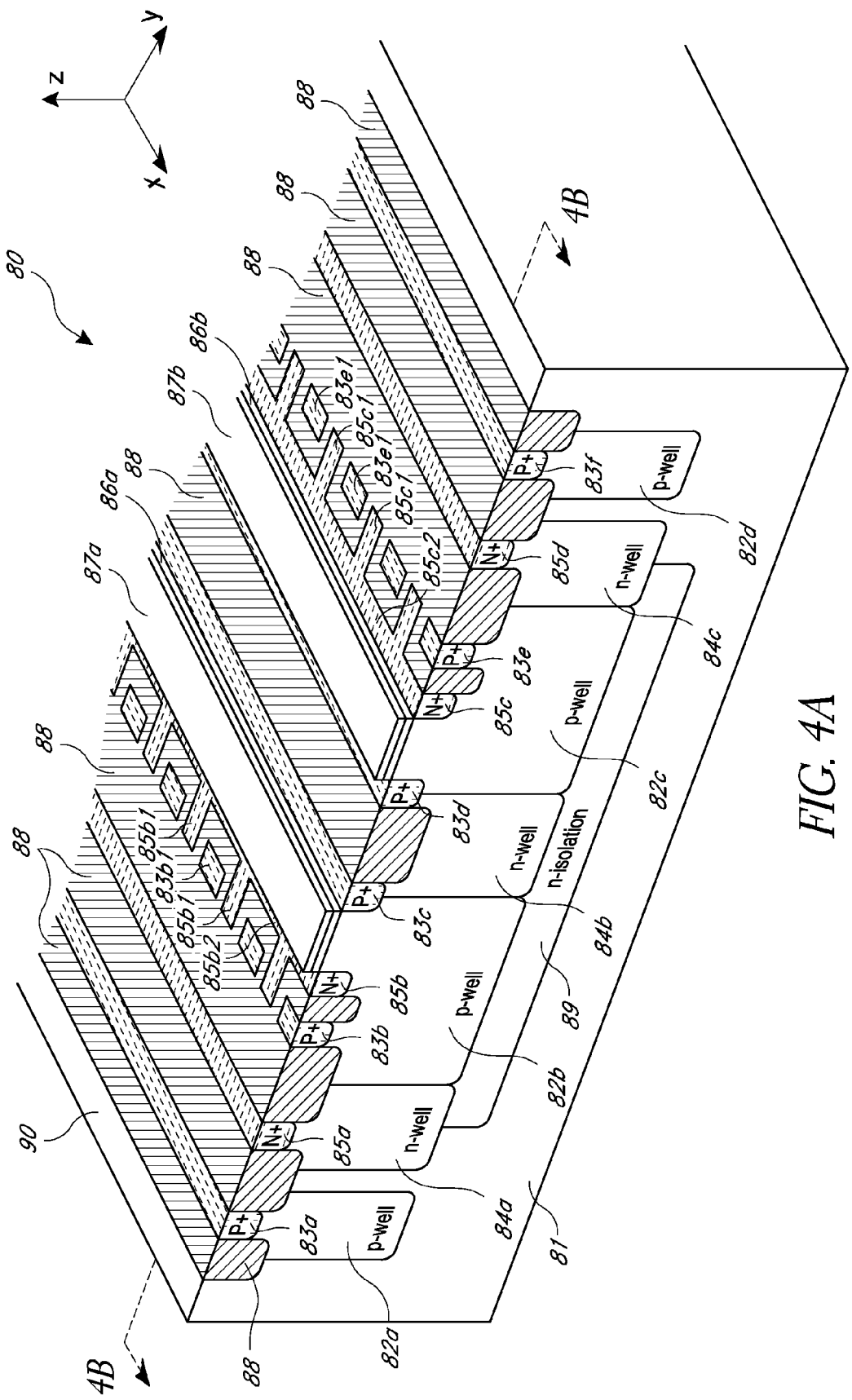
FIG. 4A is a schematic perspective view of a bi-directional protection device implementing the protection circuit of FIG. 3 according to one embodiment.

FIG. 4A is a schematic perspective view of a bi-directional protection device 80 implementing the protection circuit 60 of FIG. 3 according to one embodiment. The protection device 80 includes a p-type substrate 81, first to fourth p-wells 82a-82d, first to sixth p-type active areas 83a-83f, first to third n-wells 84a-84c, first to fourth n-type active areas 85a-85d, first and second gate oxide layers 86a, 86b, first and second gate layers 87a, 87b, oxide regions 88, and n-type isolation layer 89.

As illustrated in FIG. 4A, the substrate 81 has the first to third n-wells 84a-84c and the first to fourth p-wells 82a-82d formed therein. The second and third p-wells 82b, 82c are disposed on opposite sides of the second n-well 84b. The first n-well 84a is disposed on a side of the second p-well 82b opposite the second n-well 84b. The third n-well 84c is disposed on on a side of the third p-well 82c opposite the second n-well 84b. The n-type isolation layer 89 is disposed beneath the second n-well 84b, the second and third p-wells 82b, 82c, and beneath a portion of the first and third n-wells 84a, 84c. The first p-well 82a is formed adjacent the first n-well 84a on a side of the first n-well 84a opposite the second p-well 82b. The fourth p-well 82d is formed adjacent the third n-well 84c on a side of the third n-well 84c opposite the third p-well 82c. In the illustrated configuration, the first and fourth p-wells 82a, 82d are spaced from the first and third n-wells 84a, 84c, respectively, such that the first p-well 82a does not abut the first n-well 84a and the fourth p-well 82d does not abut the third n-well 84c. However, other implementations are possible.

The first and sixth p-type active areas 83a, 83f are disposed in the first and fourth p-wells 82a, 82d, respectively. The first and fourth n-type active areas 85a, 85d are disposed in the first and third n-wells 84a, 84c, respectively. The first and second gate oxide layers 86a, 86b are disposed on the surface of the substrate 81 over the second and third p-wells 82b, 82c, respectively. The first and second gate layers 87a, 87b are disposed over the first and second gate oxide layers 86a, 86b, respectively, and can be polysilicon layers. The third p-type active area 83c is disposed on a first side of the first gate layer 87a, and includes a first portion disposed in the second p-well 82b and a second portion disposed in the second n-well 84b. The second n-type active area 85b is disposed in the second p-well 82b on a second side of the first gate layer 87a opposite the first side. The fourth p-type active area 83d is disposed on a first side of the second gate layer 87b, and includes a first portion disposed in the third p-well 82c and a second portion disposed in the second n-well 84b. The third n-type active area 85c is disposed in the third p-well 82c on a second side of the first gate layer 87b opposite the first side. The second p-type active area 83b is disposed in the second p-well 82b on a side of the second n-type active area 85b opposite the first gate layer 87a. The fifth p-type active area 83e is disposed in the third p-well 82c on a side of the third n-type active area 85c opposite the second gate layer 87b.

In the illustrated embodiment, the protection device 80 is formed in the substrate 81, which can be a p-type substrate. In another embodiment, the substrate can include a p-type epitaxial layer formed on a silicon (Si) substrate. Although not illustrated in FIG. 4A, the substrate 81 can also include other devices or structures formed therein.

In one embodiment, the p-wells 82a-82d and the n-wells 84a-84c can be similar to one another, and can have a depth ranging between about 1.5 μm and about 5.5 μm from the surface 90 of the substrate 81. In one implementation, the p-type active areas 83a-83f and n-type active areas 85a-85d have a depth that is about 15 times to about 25 times less than a depth of the well within which the active area is formed. The oxide regions 88 can have any suitable depth, such as depth that is about 5 times to about 15 times less than the depth of the p-wells 82a-82d. In certain implementations, the oxide regions 88 can be relatively deeper than the p-type active areas 83a-83f and n-type active areas 85a-85d.

In the illustrated embodiment, the second p-type active area 83b includes a plurality of island regions 83b1 disposed along the x-direction, and the fifth p-type active area 83e includes a plurality of island regions 83e1 disposed along the x-direction. Additionally, the second n-type active area 85b includes an elongated region 85b2 extending in the x-direction and a plurality of protruding regions 85b1 that extend in the y-direction away from the gate layer 87a. As shown in FIG. 4A, each of the protruding regions 85b1 extends between two of the island regions 83b1. Similarly, the third n-type active area 85c includes an elongated region 85c2 extending in the x-direction and a plurality of protruding regions 85c1 extending in the y-direction away from the gate layer 87b. Each of the protruding regions 85c1 extends between two of the island regions 83e1. Configuring the second and fifth p-type actives areas 83b, 83e and the second and third n-type active areas 85b, 85c in this manner can aid in reducing the holding and/or trigger voltage of the protection device 80, as will be described in further detail below. While illustrated and described with reference to x-directions, y-directions, and z-directions, it will be understood that the directions can be interchanged and can vary based on view.

The first and third n-wells 84a, 84c and the n-type isolation layer 89 can aid in electrically isolating the second and third p-wells 82b, 82c from the substrate 81, thereby permitting the p-type substrate 81 and the second and third p-wells 82b, 82c to operate at different electrical potentials. As used herein, and as will be understood by one of skill in the art, the term "n-type isolation layer" refers to any suitable n-type isolation layer, including, for example, those used in silicon-on-insulator (SOI) technologies, buried n-layer technologies, or in deep n-well technologies. In certain implementations described herein, the first to third n-wells 84a-84c and the n-type isolation layer 89 are configured to be electrically floating. Although the bi-directional protection device 80 is illustrated as including the first and third n-wells 84a, 84c and the n-type isolation layer 89, in certain implementations, the bi-directional protection device 80 can be isolated from a substrate in other ways. For example, isolation can be achieved when using silicon-on-insulator (SOI) processes by using dielectric structures. SOI processes can be employed in a variety of applications, including, for example, applications having high robustness requirements.

The first and fourth p-wells 82a, 82d and the first and sixth p-type active areas 83a, 83f can form a guard ring around the protection device 80. The guard ring can be employed to eliminate the formation of unintended parasitic paths between the protection device 80 and surrounding semiconductor components when integrated on-chip.

The illustrated bi-directional protection device 80 includes the oxide regions 88. Formation of the isolation regions can involve etching trenches in the substrate 81, filling the trenches with a dielectric, such as silicon dioxide ($SiO_2$), and removing the excess dielectric using any suitable method, such as chemical-mechanical planarization. In certain implementations, the oxide regions 88 can be shallow trench regions, deep trench regions or local oxidation of silicon (LOCOS) regions disposed between active areas.

The protection device 80 can undergo back end processing to form contacts and metallization. Skilled artisans will appreciate that these details have been omitted from this figure for clarity.

Figure 4B:
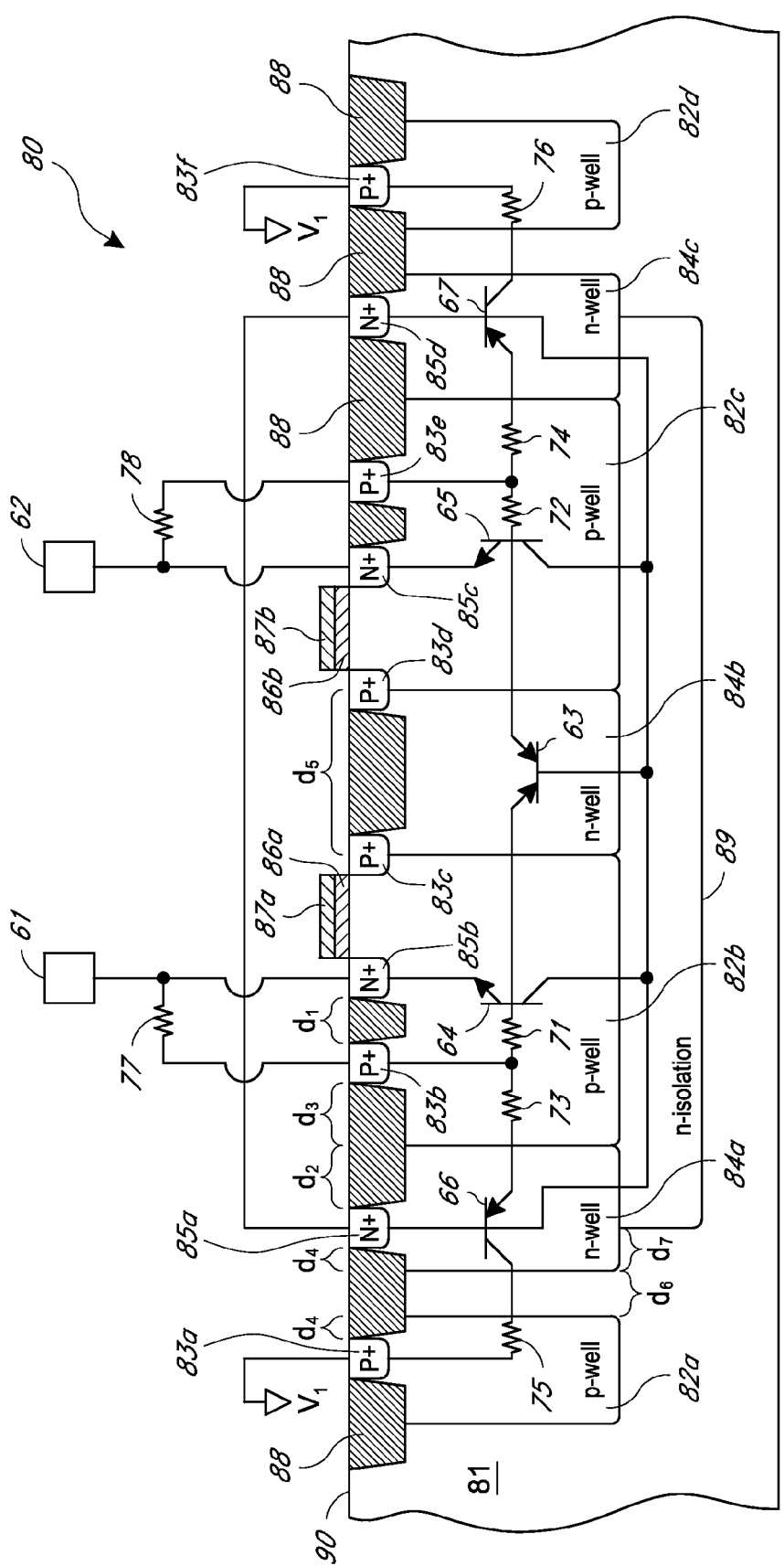
FIG. 4B is an annotated cross section view of the protection device of FIG. 4A, taken along the lines 4B-4B.

FIG. 4B is a cross section view of the protection device 80 of FIG. 4A, taken along the lines 4B-4B. The protection device 80 includes the p-type substrate 81, the first to fourth p-wells 82a-82d, the first to sixth p-type active areas 83a-83f, the first to third n-wells 84a-84c, the first to fourth n-type active areas 85a-85d, the first and second gate oxide layers 86a, 86b, the first and second gate layers 87a, 87b, the oxide regions 88, and the n-type isolation layer 89, which can be as described above with respect to FIG. 4A.

The cross section has been annotated to show examples of circuit devices formed from the illustrated structure, such as the bi-directional bipolar transistor 63, the first and second NPN bipolar transistors 64, 65, the first and second PNP bipolar transistors 66, 67, and the first to sixth resistors 71-76. Additionally, the cross section has been annotated to show the seventh and eighth resistors 77, 78, which can be included in certain implementations, and which can be formed by using, for example, n-diffusion and/or poly silicon. Furthermore, the cross section has been annotated to show the first and second pads 61, 62 as well as electrical connections within the protection device 80 and to the pads.

The first pad 61 is electrically connected to a first end of the seventh resistor 77 and to the second n-type active area 85b. The seventh resistor 77 further includes a second end electrically connected to the second p-type active area 83b. The second pad 62 is electrically connected to a first end of the eighth resistor 78 and to the third n-type active area 85c. The eighth resistor 78 further includes a second end electrically connected to the fifth p-type active area 83e. The first n-type active area 85a is electrically connected to the fourth n-type active area 85d. The first and sixth p-type active areas 83a, 83f are electrically connected to the first supply voltage $V_1$.

The bi-directional bipolar transistor 63 can be formed from the second n-well 84b and the second and third p-wells 82b, 82c. For example the bi-directional bipolar transistor 63 can have an emitter/collector E/C formed from the second p-well 82b, a base formed from the second n-well 84b, and a collector/emitter C/E formed from the third p-well 82c. The first and second NPN bipolar transistors 64, 65 can be formed from the second and third n-type active areas 85b, 85c, from the second and third p-wells 82b, 82c, and from the n-type isolation layer 89, and can be vertical parasitic NPN bipolar devices. For example, the first NPN bipolar transistor 64 can have an emitter formed from the second n-type active area 85b, a base formed from the second p-well 82b, and a collector formed from the n-type isolation layer 89. Additionally, the second NPN bipolar transistor 65 can have an emitter formed from the third n-type active area 85c, a base formed from the third p-well 82c, and a collector formed from the n-type isolation layer 89. The first and second PNP bipolar transistors 66, 67 can be formed from the first to fourth p-wells 82a-82d and the first and third n-wells 84a, 84c, and can be lateral parasitic PNP bipolar devices. For example, the first PNP bipolar transistor 66 can have an emitter formed from the second p-well 82b, a base formed from the first n-well 84a, and a collector formed from the first p-well 82a. Additionally, the second PNP bipolar transistor 67 can have an emitter formed from the third p-well 82c, a base formed from the third n-well 84c, and a collector formed from the fourth p-well 82d.

The first and third resistors 71, 73 can be formed from the resistance of the second p-well 82b, and the second and fourth resistors 72, 74 can be formed from the resistance of the third p-well 82c. Additionally, the fifth resistor 75 can be formed from the resistance between the collector of the first PNP bipolar transistor 66 and the first p-type active area 83a, and the sixth resistor 76 can be formed from the resistance between the collector of the second PNP bipolar transistor 67 and the sixth p-type active area 83f. The seventh and eighth resistors 77, 78 can be included in certain implementations, and can represent the resistance of the polysilicon, diffusion, and/or other material from which the seventh and eight resistors 77, 78 are formed. However, the seventh and eight resistors 77, 78 can be omitted in certain embodiments.

Persons having ordinary skill in the art will appreciate that the cross section shown in FIG. 4B can correspond to the protection circuit 60 shown in FIG. 3. Although the protection device 80 of FIGS. 4A-4B illustrates one implementation of the protection circuit 60 of FIG. 3, other implementations are possible.

The third and fourth p-type active areas 83c, 83d can aid in controlling the trigger voltage of the bi-directional protection device 80. For example, the third and fourth p-type active areas 83c, 83d can have a higher doping concentration than the second and third p-wells 82c, 82d, respectively, and thus can be used to control the breakdown voltage of the bi-directional PNP bipolar transistor 63. Additionally, in certain implementations, the third and fourth p-type active areas 83c, 83d can also impact the holding voltage of the bi-directional protection device 80. As shown in FIG. 4B, the third and fourth p-type active areas 83c, 83d can be configured to be electrically floating.

With reference to FIGS. 4A-4B, the second and third n-type active areas 85b, 85c can serve as electron injection centers and recombination centers for holes injected into the second and third p-wells 82b, 82c, respectively. By configuring the second n-type active area 85b to include elongated portions 85b1 that extend between island regions 83b1 of the second p-type active area 83b, and by configuring the third n-type active area 85c to include elongated portions 85c1 that extend between island regions 83e1 of the fifth p-type active area 83e, the operation of the second and third n-type active areas 85b, 85c as electron injection centers and hole recombination centers can be enhanced. By enhancing the injection of electrons and recombination of holes, the gain of the bi-directional bipolar transistor 63 can be enhanced. Furthermore, increasing the injection of electrons and recombination of holes can adjust the holding voltage such that the risk of latch-up is reduced. Additionally, forming the second and fifth p-type active areas 83b, 83e from the island regions 83b1, 83e1, respectively, can increase the resistance of the second and third p-wells 82b, 82c and increase the build-up of the base-emitter voltages of the first and second NPN bipolar transistors 64, 65, thereby expediting the clamping speed of the protection device during a transient electrical event, including, for example, the clamping speed in low voltage applications.

With reference back to FIG. 4B, the protection device 80 has been annotated to show various dimensions of the wells, regions, and layers described above. In FIG. 4B, the protection device 80 is symmetrical. Accordingly, although dimensions are described below with respect to the left half of the device, the right half of the device can have the same dimensions. Persons having ordinary skill in the art will appreciate that the teachings herein are also applicable to asymmetric devices. For example, asymmetrical structures can be provided by arranging the wells, active regions, and/or other structures of the device in an asymmetric configuration.

A first spacing $d_1$ between the second p-type active area 83*b* and the second n-type active area 85*b* can be selected to be a relatively short distance, such as the minimum spacing permitted by the process technology. Selecting the spacing $d_1$ to be relatively short can improve the operation of the second n-type active area 85*b* as a recombination center for holes injected into the second p-well 82*b*. The operation of the second n-type active area 85*b* as a recombination center for holes can be further enhanced by configuring the second n-type active area 85*b* to include elongated portions 85*b*1 that extend between island regions 83*b*1 of the second p-type active area 83*b*, as was described above with respect to FIG. 4A. Reducing the first spacing $d_1$ can be used to fine tune the trigger voltage of the protection device 80 while achieving a reduction in area. In certain implementations, the first spacing $d_1$ can be selected to be in the range of about 0 µm (abutting) to about 1.5 µm, for example, about 1 µm. However, other dimensions will be readily determined by one of skill in the art.

A second spacing $d_2$ between an edge of the first n-type active area 85*a* and an edge of the second p-well 82*b* can be selected to be sufficiently large to avoid the first PNP bipolar transistor 66 of FIG. 3 from breaking down between the first p-well 82*a* and the second p-well 82*b* during a transient electrical event. Likewise, a third second spacing $d_3$ between an edge of the second p-type active area 83*b* and an edge of the first n-well 84*a* can be selected to be sufficiently large to avoid the first PNP bipolar transistor 66 of FIG. 3 from breaking down between the first p-well 82*a* and the second p-well 82*b* during a transient electrical event. In certain implementations, the second spacing $d_2$ can be selected to be in the range of about 1.5 µm to about 3 µm, for example, about 2.75 µm, and the third spacing $d_3$ can be selected to be in the range of about 1.5 µm to about 3 µm, for example, about 2.5 µm. However, other dimensions will be readily determined by one of skill in the art.

A fourth spacing $d_4$ has been used to denote a distance between an edge of the first p-type active area 83*a* and an edge of the first p-well 82*a* facing the first n-well 84*a* and a distance between an edge of the first n-type active area 85*a* and an edge of the first n-well 84*a* facing the first p-well 82*a*. In certain implementations, the fourth spacing $d_4$ can be selected to be in the range of about 1.5 µm to about 3 µm, for example, about 2.5 µm. However, other dimensions will be readily determined by one of skill in the art. Additionally, in certain implementations, the distance between the edge of the first p-type active area 83*a* and the edge of the first p-well 82*a* and the distance between the edge of the first n-type active area 85*a* and the edge of the first n-well 84*a* need not be the same.

A fifth spacing $d_5$ representing the width of the second n-well 84*b* can be selected based on a desired holding voltage characteristics of the bi-directional bipolar transistor 63. In certain low voltage implementations, the fifth spacing $d_5$ can be selected to be in the range of about 2 µm to about 6 µm, for example, about 3.5 µm. However, other dimensions will be readily determined by one of skill in the art.

A sixth spacing $d_6$ has been used to denote a distance between the first p-well 82*a* and the first n-well 84*a*. The sixth spacing $d_6$ can be increased to increase breakdown voltage of the protection device 80 to the substrate 81, which can aid in preventing the device 80 from getting damaged or injecting current into to the substrate when the device is stressed at relatively high signaling conditions, such as at 30 A peak currents and 15 kV peak voltages associated with IEC61000-4-2 stress conditions. In certain implementations, the sixth spacing $d_6$ can be selected to be in the range of about 0 µm to about 2 µm, for example, about 1 µm. However, other dimensions will be readily determined by one of skill in the art.

A seventh spacing $d_7$ has been used to denote a distance between an edge of the first n-well 84*a* and an edge of the n-type isolation layer 89. In certain implementations, the seventh spacing $d_7$ can be selected to be in the range of about 0 µm (aligned) to about 2.5 µm, for example, about 2.25 µm. However, other dimensions will be readily determined by one of skill in the art.

The protection device 80 includes the gate layers 87*a*, 87*b*, which have been used to define edges of the second and third n-type active areas 85*b*, 85*c* and the third and fourth p-type active areas 83*c*, 83*d*. For example, the second n-type active area 85*b* and the third p-type active area 83*c* have been formed on opposite sides of the first gate layer 87*a*, and the third n-type active area 85*c* and the fourth p-type active area 83*d* have been formed on opposite sides of the second gate layer 87*b*. Accordingly, the gate layers 87*a*, 87*b* can serve as implant blocking structures in certain implementations. In the illustrated configuration, the protection device 80 does not include metal oxide semiconductor (MOS) transistor devices, since active areas of different doping polarities have been formed on opposing sides of the first and second gate layers 87*a*, 87*b*. Rather, the gate layers 87*a*, 87*b* have been used as an implant mask when doping the second and third n-type active areas 85*b*, 85*c* and the third and fourth p-type active areas 83*c*, 83*d*. Although an oxide region can be used to define the edges of the second and third n-type active areas 85*b*, 85*c* and the third and fourth p-type active areas 83*c*, 83*d* in some implementations, using gate layers to define these regions can permit a relatively larger carrier concentration to flow near the surface 90 of the substrate 81, thereby permitting the protection device 80 to have enhanced current handling capability, faster turn-on speed, and/or a lower trigger voltage.

In one embodiment, the protection device 80 can have a trigger voltage of about +/−(3-14) V and a holding voltage in the range of +/−(1.5-10) V. Accordingly, the protection device 80 can provide protection to ICs having low trigger and holding voltage requirements, such as ICs including pins that operate under very low common mode voltage and low signal processing noise conditions while operating in harsh environments. The protection device 80 can provide protection against an ESD event in the typical range of 2,000 to 8,000 V ESD stress condition while reducing the protection device footprint in a variety of applications, including, for example, in very low voltage operation interface applications.

Figure 5A:
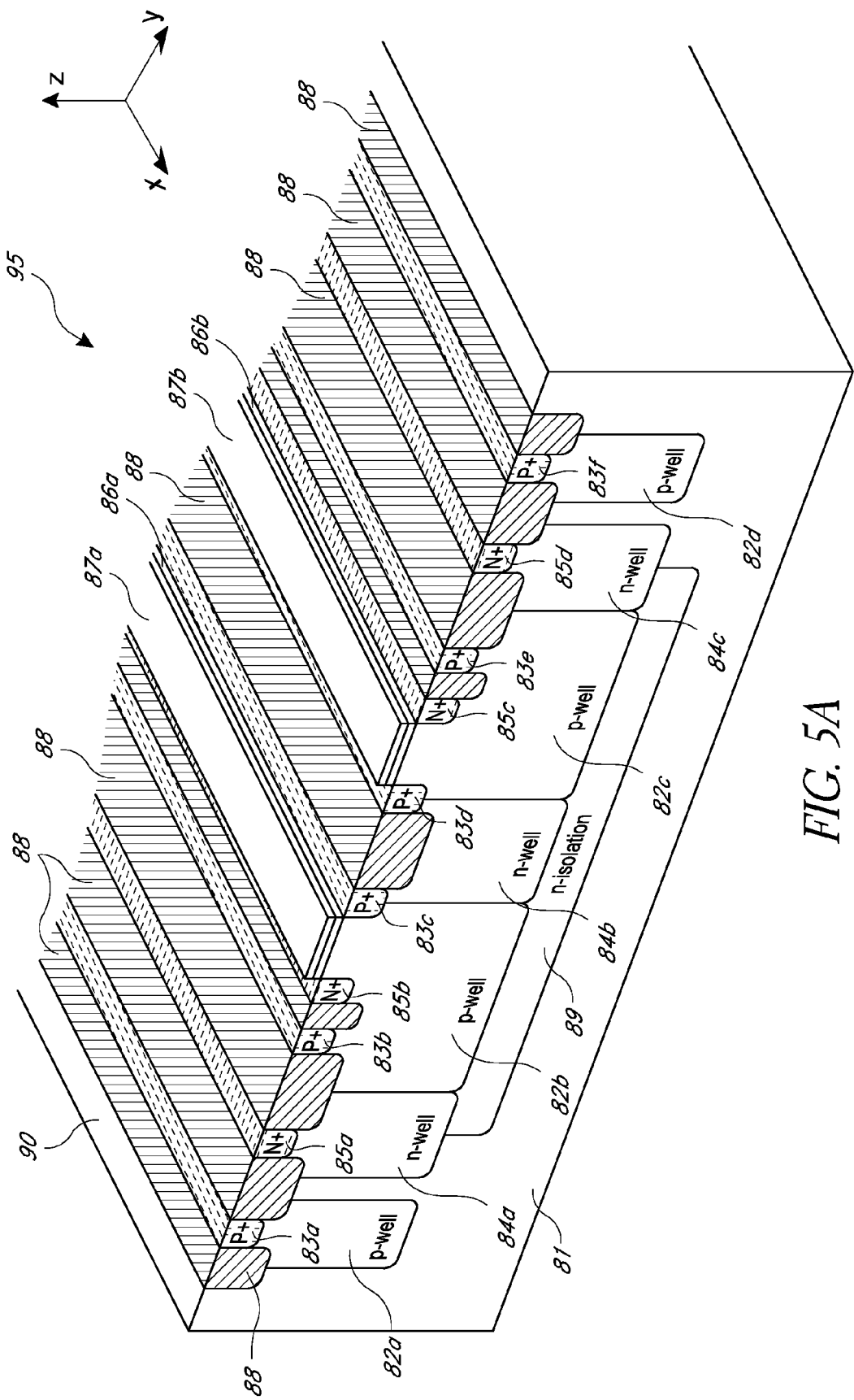
FIG. 5A is a schematic perspective view of a bi-directional protection device implementing the protection circuit of FIG. 3 according to another embodiment.

FIG. 5A is a schematic perspective view of a bi-directional protection device 95 implementing the protection circuit 60 of FIG. 3 according to another embodiment. The protection device 95 includes the p-type substrate 81, the first to fourth p-wells 82*a*-82*d*, the first to sixth p-type active areas 83*a*-83*f*, the first to third n-wells 84*a*-84*c*, the first to fourth n-type active areas 85*a*-85*d*, the first and second gate oxide layers 86*a*, 86*b*, the first and second gate layers 87*a*, 87*b*, the oxide regions 88, and the n-type isolation layer 89.

The protection device 95 of FIG. 5A can be similar to the protection device 80 described above with reference to FIGS. 4A-4B. However, in contrast to the protection device 80 of FIGS. 4A-4B, the second and fifth p-type active areas 83*b*, 83*e* and the second and third n-type active areas 85*b*, 85*c* have been arranged in a different layout configuration. For example, in the implementation illustrated in FIG. 5A, the second and fifth p-type active areas 83*b*, 83*e* and the second and third n-type active areas 85*b*, 85*c* each are formed from channels extending along the x-direction parallel to the first and second gate layers 87a, 87b. Configuring the second and fifth p-type active areas 83b, 83e and the second and third n-type active areas 85b, 85c in this manner can be used to increase the trigger and lowering the holding voltages of the protection device 95 of FIG. 5A relative to the protection device 80 of FIGS. 4A-4B.

Figure 5B:
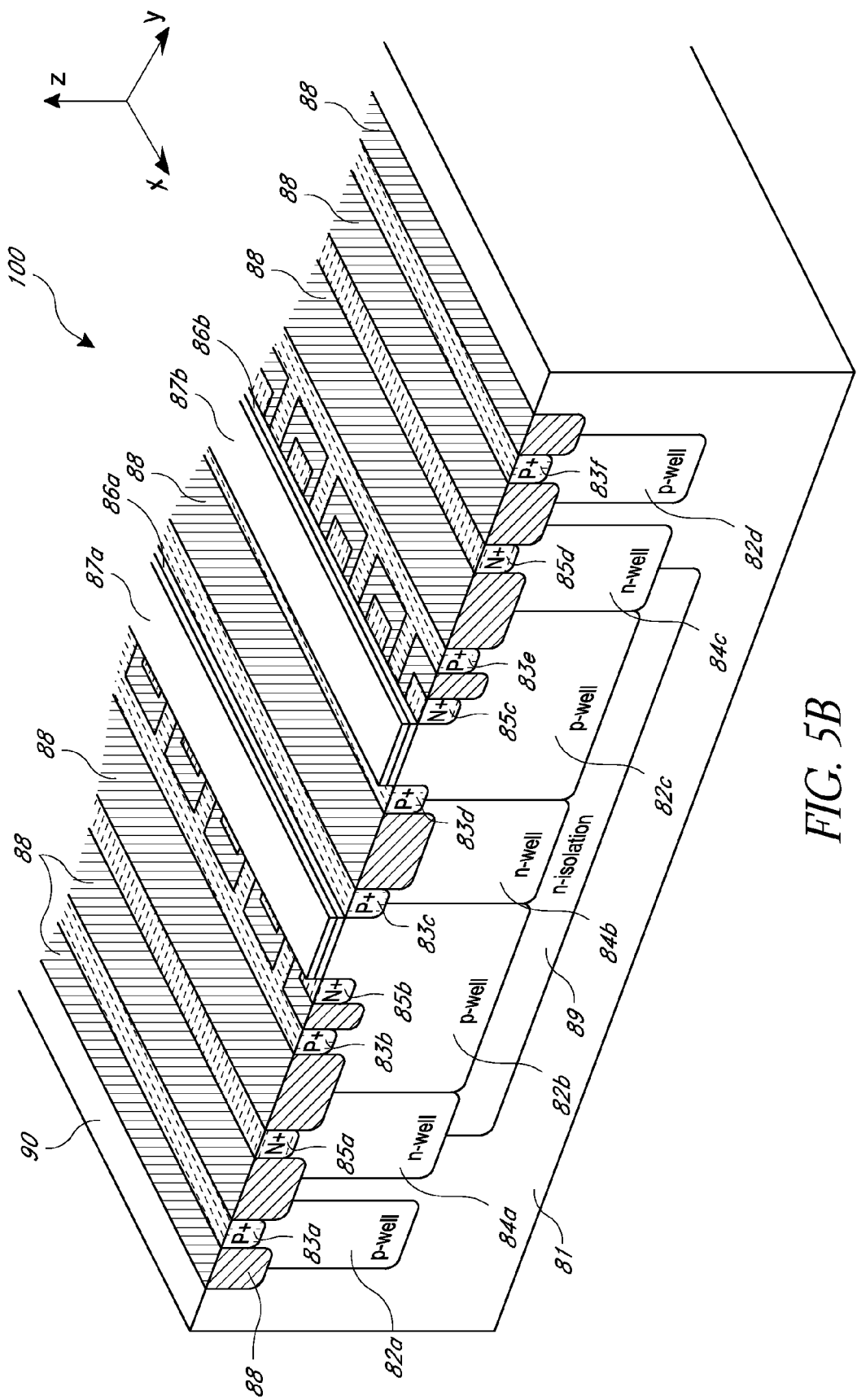
FIG. 5B is a schematic perspective view of a bi-directional protection device implementing the protection circuit of FIG. 3 according to yet another embodiment.

FIG. 5B is a schematic perspective view of a bi-directional protection device 100 implementing the protection circuit 60 of FIG. 3 according to yet another embodiment. The protection device 100 includes the p-type substrate 81, the first to fourth p-wells 82a-82d, the first to sixth p-type active areas 83a-83f, the first to third n-wells 84a-84c, the first to fourth n-type active areas 85a-85d, the first and second gate oxide layers 86a, 86b, the first and second gate layers 87a, 87b, the oxide regions 88, and the n-type isolation layer 89.

The protection device 100 of FIG. 5B can be similar to the protection device 80 described above with reference to FIGS. 4A-4B. However, in contrast to the protection device 80 of FIGS. 4A-4B, the second and fifth p-type active areas 83b, 83e and the second and third n-type active areas 85b, 85c have been arranged in a configuration that is complementary. For example, in the implementation illustrated in FIG. 5B, the second n-type active area 85b includes a plurality of island regions disposed along the x-direction and the second p-type active area 83b includes an elongated region disposed along the x-direction and protruding regions extending in the y-direction such that each of the protruding regions extends between two of the island regions. Similarly, the third n-type active area 85c includes a plurality of island regions disposed along the x-direction and the fifth p-type active area 83e includes an elongated region disposed along the x-direction and protruding regions extending in the y-direction such that each of the protruding regions extends between two of the island regions. Configuring the second and fifth p-type active areas 83b, 83e and the second and third n-type active areas 85b, 85c in this manner can be used to increase the trigger and holding voltages of the protection device 100 of FIG. 5B relative to the protection device 80 of FIGS. 4A-4B and the protection device 95 of FIG. 5A.

Figure 6:
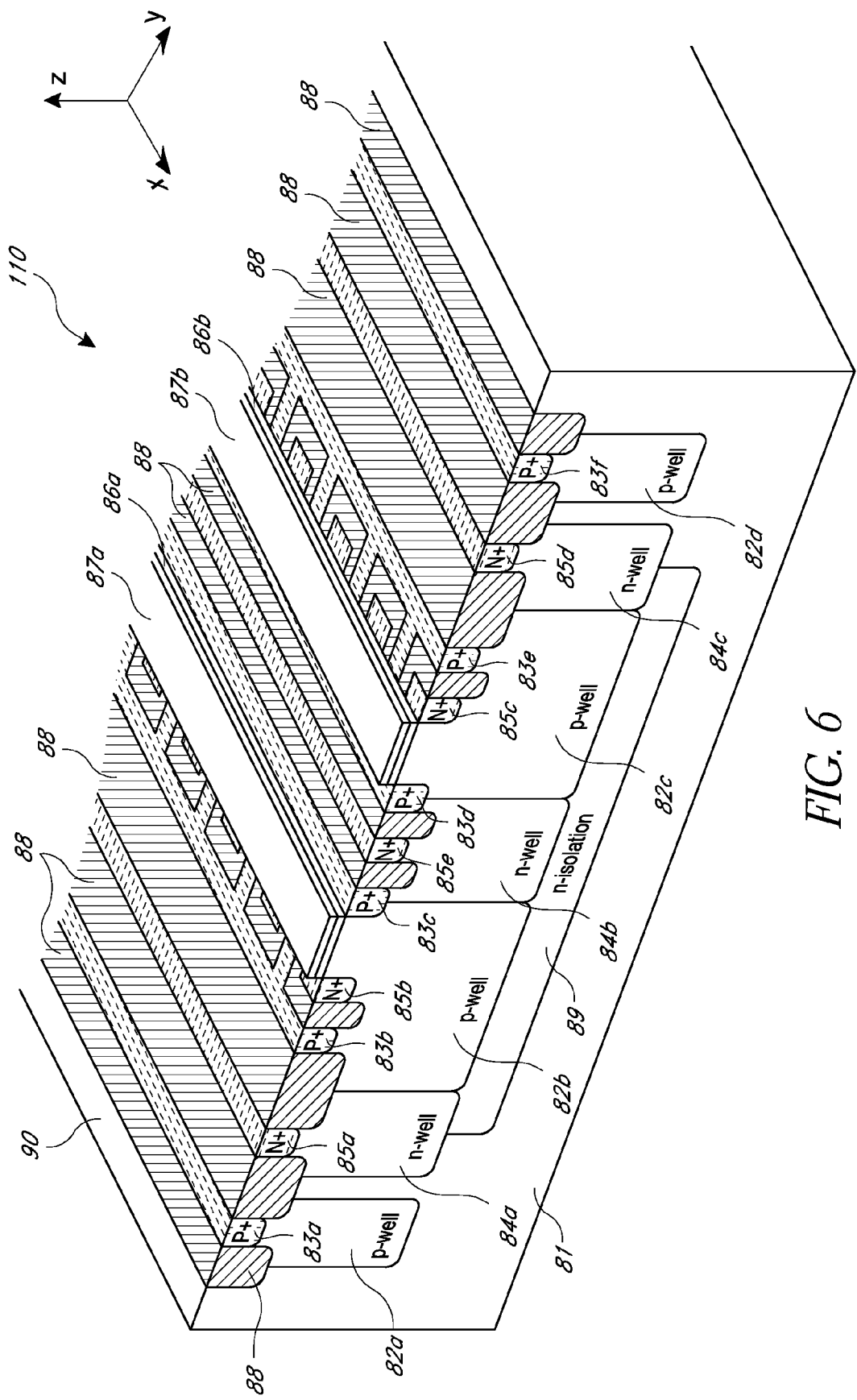
FIG. 6 is a schematic perspective view of a bi-directional protection device implementing the protection circuit of FIG. 3 according to yet another embodiment.

FIG. 6 is a schematic perspective view of a bi-directional protection device 110 implementing the protection circuit 60 of FIG. 3 according to yet another embodiment. The protection device 110 includes the p-type substrate 81, the first to fourth p-wells 82a-82d, the first to sixth p-type active areas 83a-83f, the first to third n-wells 84a-84c, first to fifth n-type active areas 85a-85e, the first and second gate oxide layers 86a, 86b, the first and second gate layers 87a, 87b, the oxide regions 88, and the n-type isolation layer 89.

The protection device 110 of FIG. 6 can be similar to the protection device 100 described above with reference to FIG. 5B. However, in contrast to the protection device 100 of FIG. 5B, the protection device 110 further includes the fifth n-type active area 85e disposed between the third and fourth p-type active areas 83c, 83d in the second n-well 84b. Including the fifth n-type active area 85e in the second n-well 84b can increase the concentration of electrons in the second n-well 84b, thereby enhancing the conduction of the bi-directional bipolar transistor 63, including the surface conduction of the transistor. The inclusion of the fifth n-type active area 85e can also increase n-type doping in the second n-well 84b, which can increase electron concentration in the base of the bi-directional bipolar transistor 63 of FIG. 4B, thereby helping to control the bipolar device gain and fine-tuning the protection device activation breakdown.

Figure 7:
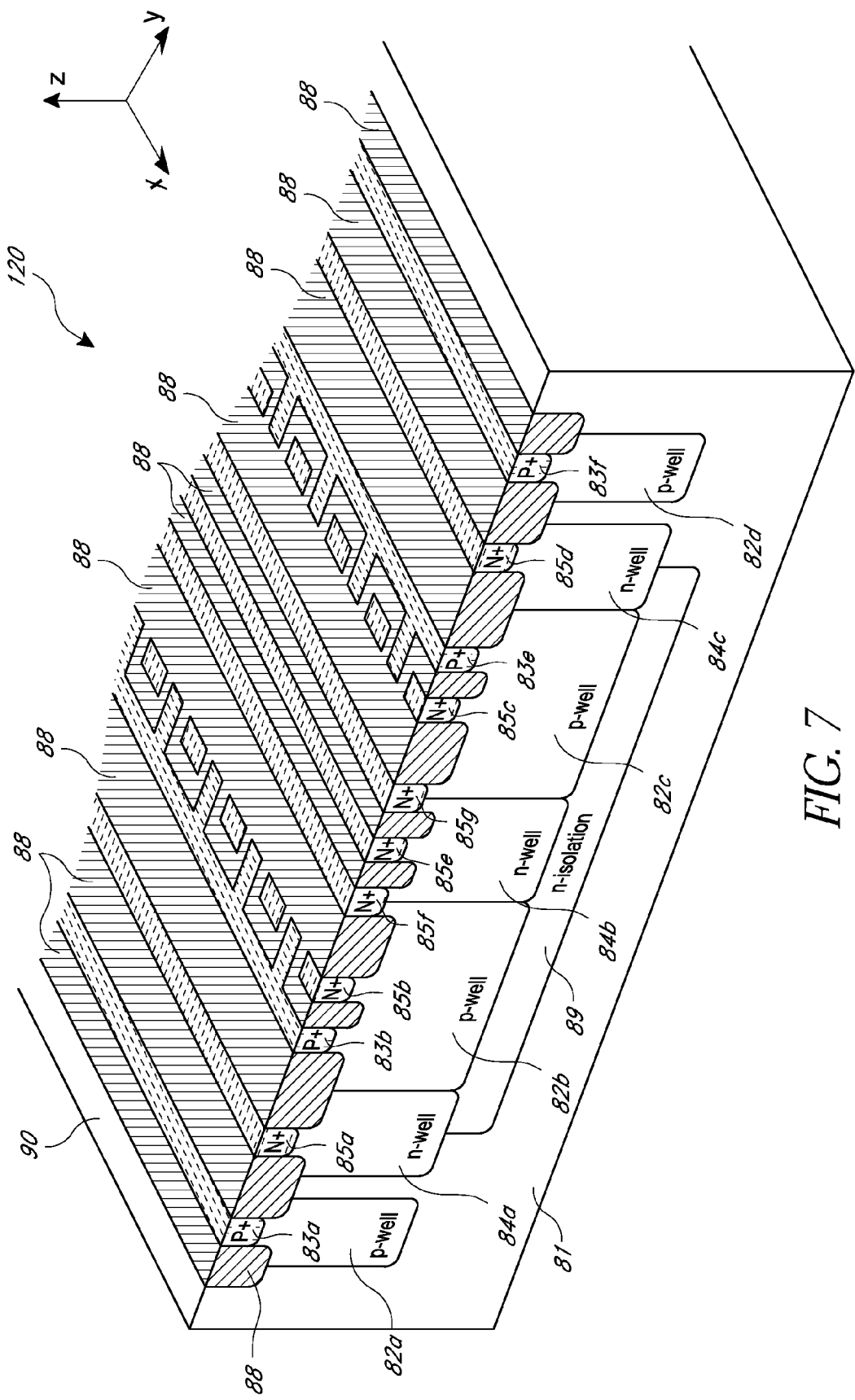
FIG. 7 is a schematic perspective view of a bi-directional protection device implementing the protection circuit of FIG. 3 according to yet another embodiment.

FIG. 7 is a schematic perspective view of a bi-directional protection device 120 implementing the protection circuit 60 of FIG. 3 according to yet another embodiment. The protection device 120 includes the p-type substrate 81, the first to fourth p-wells 82a-82d, the first and second p-type active areas 83a, 83b, the fifth and sixth p-type active areas 83e, 83f, the first to third n-wells 84a-84c, first to seventh n-type active areas 85a-85g, the oxide regions 88, and the n-type isolation layer 89. The bi-directional protection device 120 does not include the first and second gate layers 87a, 87b, the first and second gate oxide layers 86a, 86b, and the third and fourth p-type active areas 83c, 83d shown in FIG. 6. In the illustrated configuration, the gate layers 87a, 87b and the gate oxide layers 86a, 86b have been replaced by the oxide regions 88, which serve as implant blocking structures in the illustrate configuration.

In contrast to the protection device 110 of FIG. 6, the protection device 120 of FIG. 7 has replaced the third and fourth p-type active areas 83c, 83d with the sixth and seventh n-type active areas 85f, 85g, respectively. Replacing the third and fourth p-type active areas 83c, 83d with the sixth and seventh n-type active areas 85f, 85g can provide enhanced flexibility by defining a different type of blocking junction condition. For example, replacing the third and fourth p-type active areas 83c, 83d with the sixth and seventh n-type active areas 85f, 85g can allow an n-type active area to p-well breakdown condition to determine the breakdown voltage of the protection device. In certain implementations, configuring the protection device in this manner allows for a slightly lower breakdown voltage relative to embodiments of the protection device in which the breakdown voltage is determined by a p-type active area to n-well breakdown condition. The protection device 110 of FIG. 6 can be suitable for a variety of applications, including, for example, applications in which the protection device is configured to protect core devices that have breakdowns defined by similar junctions, such as between an n-type source or drain and a p-well body in an NMOS transistor.

The protection device 120 of FIG. 6 does not include the first and second gate layers 87a, 87b and the first and second gate oxide layers 86a, 86b. Rather, the gate structures have been omitted in favor of using the oxide regions 88, which can eliminate potential leakage paths through the gate structures. Replacing the gate structures with the oxide regions 88 can increase the holding and/or trigger voltage of the cell by reducing conduction near the surface of the second and third p-wells 82b, 82c while providing further flexibility in the device optimization, such as device optimization for a transceiver application operating in the +/−(8-14) V range.

Figure 8:
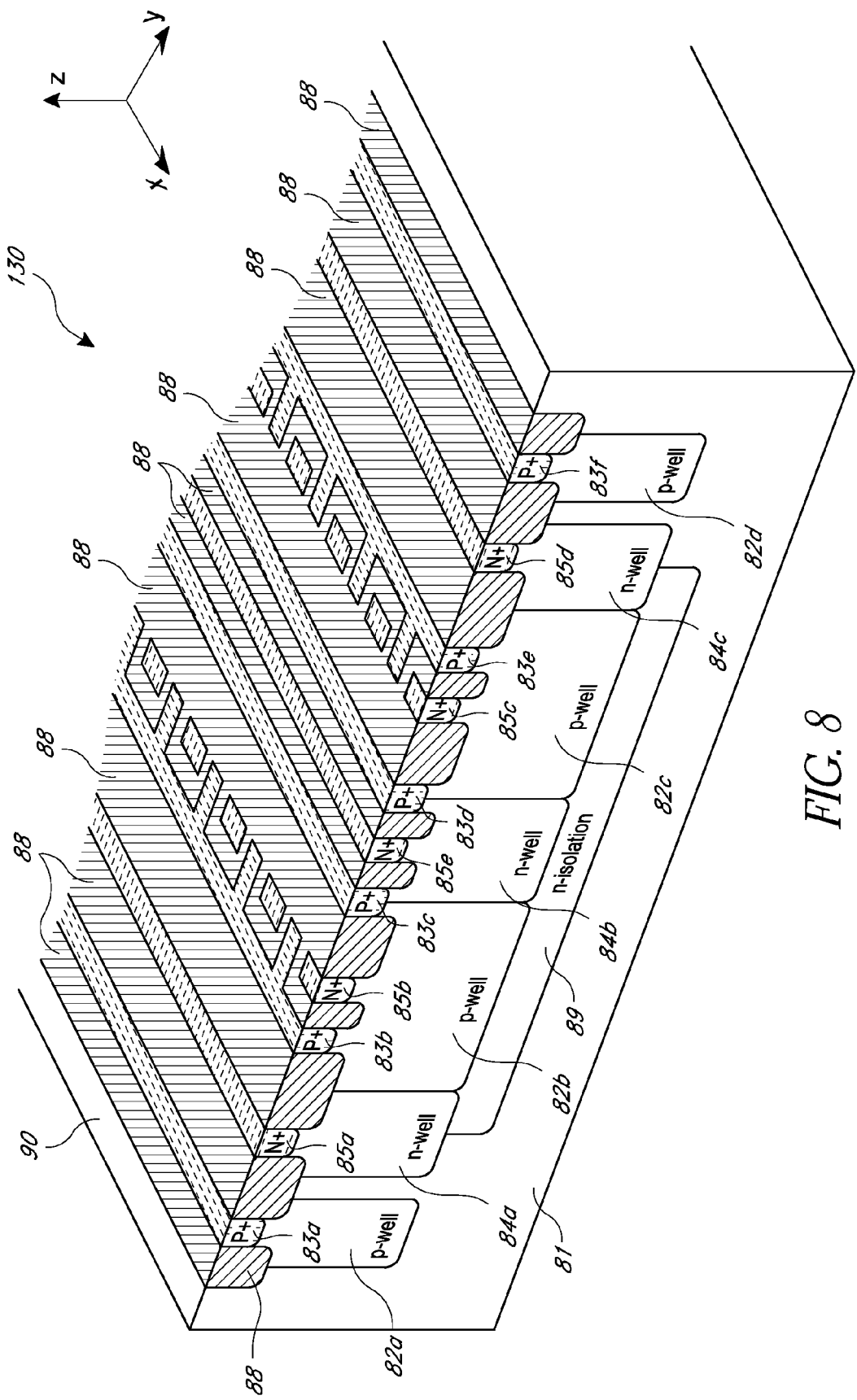
FIG. 8 is a schematic perspective view of a bi-directional protection device implementing the protection circuit of FIG. 3 according to yet another embodiment.

FIG. 8 is a schematic perspective view of a bi-directional protection device 130 implementing the protection circuit 60 of FIG. 3 according to yet another embodiment. The protection device 130 includes the p-type substrate 81, the first to fourth p-wells 82a-82d, the first to sixth p-type active areas 83a-83f, the first to third n-wells 84a-84c, first to fifth n-type active areas 85a-85e, the oxide regions 88, and the n-type isolation layer 89. The bi-directional protection device 120 does not include the first and second gate layers 87a, 87b and the first and second gate oxide layers 86a, 86b shown in FIG. 6.

The protection device 130 of FIG. 8 is similar to the protection device 110 described above with reference to FIG. 6. However, in contrast to the protection device 110 of FIG. 6, the protection device 130 of FIG. 8 does not include the first and second gate layers 87a, 87b and the first and second gate oxide layers 86a, 86b. Rather, the gate structures have been omitted in favor of using the oxide regions 88. As was described above with respect to FIG. 7, replacing the gate structures with the oxide regions 88 can increase the holding and/or trigger voltage of the protection device by reducing conduction near the surface of the second and third p-wells 82b, 82c. Additionally, using the oxide regions 88 can improve flexibility of the device in a variety of applications, including, for example, transceivers applications in the +/− (10-18) V range.

Figure 9A:
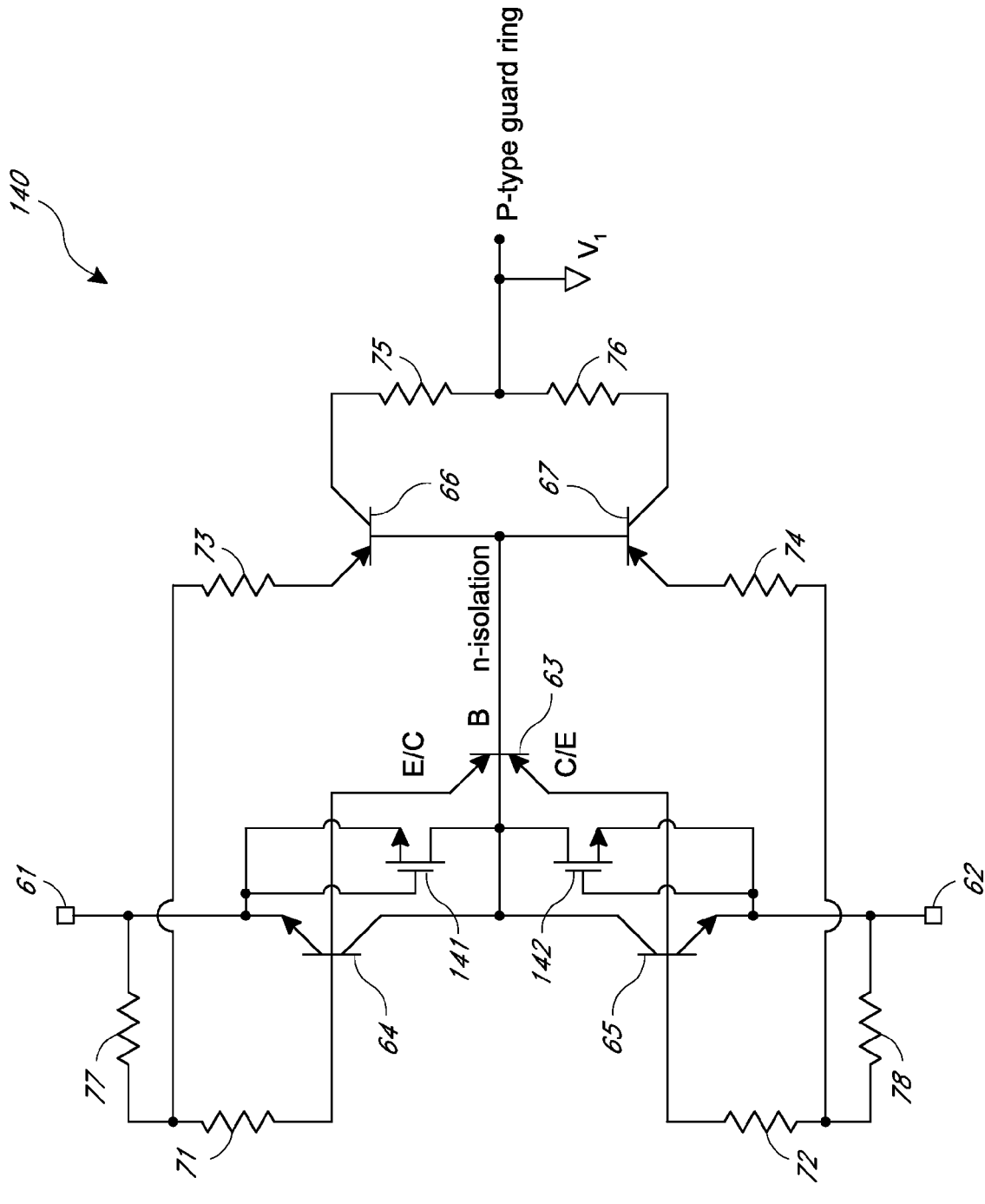
FIG. 9A is a circuit diagram illustrating a bi-directional protection circuit according to another embodiment.

FIG. 9A is a circuit diagram illustrating a bi-directional protection circuit 140 according to another embodiment. The illustrated protection circuit 140 is electrically connected between the first pad 61 and the second pad 62, and includes the bi-directional bipolar transistor 63, the first and second NPN bipolar transistors 64, 65, the first and second PNP bipolar transistors 66, 67, the first to eighth resistors 71-78, and first and second NMOS transistors 141, 142. The protection circuit 140 can be adapted to serve, for example, any of the protection devices 13a, 13b of FIGS. 2A and 2C.

The protection circuit 140 of FIG. 9A is similar to the protection circuit 60 described above with reference to FIG. 3. However, in contrast to the protection circuit 60 of FIG. 3, the protection circuit 140 of FIG. 9A further includes the first and second NMOS transistors 141, 142. For example, the first NMOS transistors 141 includes a gate and a source electrically connected to the first pad 61 and a drain electrically connected to the base of the bi-directional bipolar transistor 63. Additionally, the second NMOS transistor 142 includes a gate and a drain electrically connected to the second pad 62 and a drain electrically connected to the base of the bi-directional bipolar transistor 63.

Including the first and second NMOS transistors 141, 142 can substantially reduce the trigger voltage and/or holding voltage of the protection circuit 140 relative to the protection circuit 60 of FIG. 3. For example, when a transient electrical event causes a voltage of the first pad 61 to increase, a drain-source current and/or a displacement current coupled through the first NMOS transistor 141 can increase the base current in the bi-directional PNP bipolar transistor 63. Likewise, when a transient electrical event causes a voltage of the second pad 62 to decrease, a current through the second NMOS transistor 142 can increase the base current of the bi-directional PNP bipolar transistor 63, thereby expediting the protection device turn-on and reducing device overshoot during a transient electrical event. The first and second NMOS transistors 141, 142 can be included in a variety of applications, including, for example, applications in which protection is provided to very low voltage breakdown devices operating at less than about 4 V.

Figure 9B:
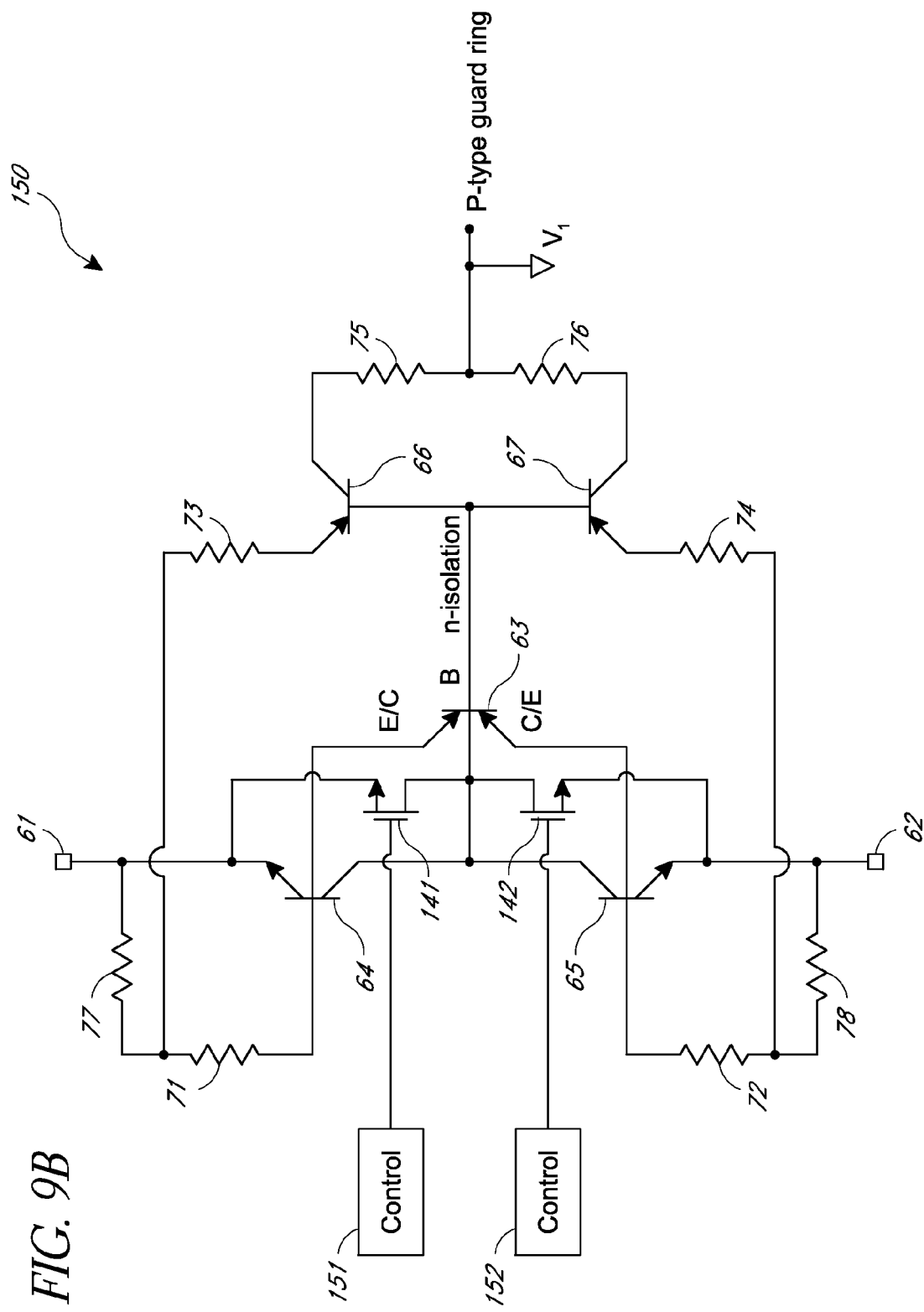
FIG. 9B is a circuit diagram illustrating a bi-directional protection circuit according to yet another embodiment.

FIG. 9B is a circuit diagram illustrating a bi-directional protection circuit 150 according to yet another embodiment. The illustrated protection circuit 150 is electrically connected between the first pad 61 and the second pad 62, and includes the bi-directional bipolar transistor 63, the first and second NPN bipolar transistors 64, 65, the first and second PNP bipolar transistors 66, 67, the first to eighth resistors 71-78, the first and second NMOS transistors 141, 142, and first and second transient detection control circuits 151, 152. The protection circuit 140 can be adapted to serve, for example, any of the protection devices 13a, 13b of FIGS. 2A and 2C.

The protection circuit 150 of FIG. 9B is similar to the protection circuit 140 described above with reference to FIG. 9A. However, in contrast to the protection circuit 140 of FIG. 9A, the protection circuit 150 of FIG. 9B further includes the first and second transient detection control circuits 151, 152. Additionally, rather than electrically connecting the gates of the first and second NMOS transistors 141, 142 to the first and second pads 61, 62, respectively, the gates of the first and second NMOS transistors 141, 142 are electrically connected to the first and second transient detection control circuits 151, 152. Using the first and second transient detection control circuits 151, 152 to control the gates of the first and second NMOS transistors 141, 142 can help prevent a gate oxide breakdown condition of the first and second NMOS transistors 141, 142 from limiting the operation of the protection circuit 150. In one implementation, the first and second control circuits each include transient detection and timer circuits using passive and/or active circuits, which are known to persons having ordinary skill in the art. The control circuits 151, 152 can be configured to generate turn-on signals for the gates of the NMOS transistors 141, 142, respectively, upon detecting a predetermined overvoltage stress condition beyond the normal operating voltage range. In certain implementations, the control circuits 151, 152 can be configured to activate the gates of the NMOS transistors 141, 142 at a voltage that is selected based on the long-term gate oxide reliability of the specific process technology.

Figure 10A:
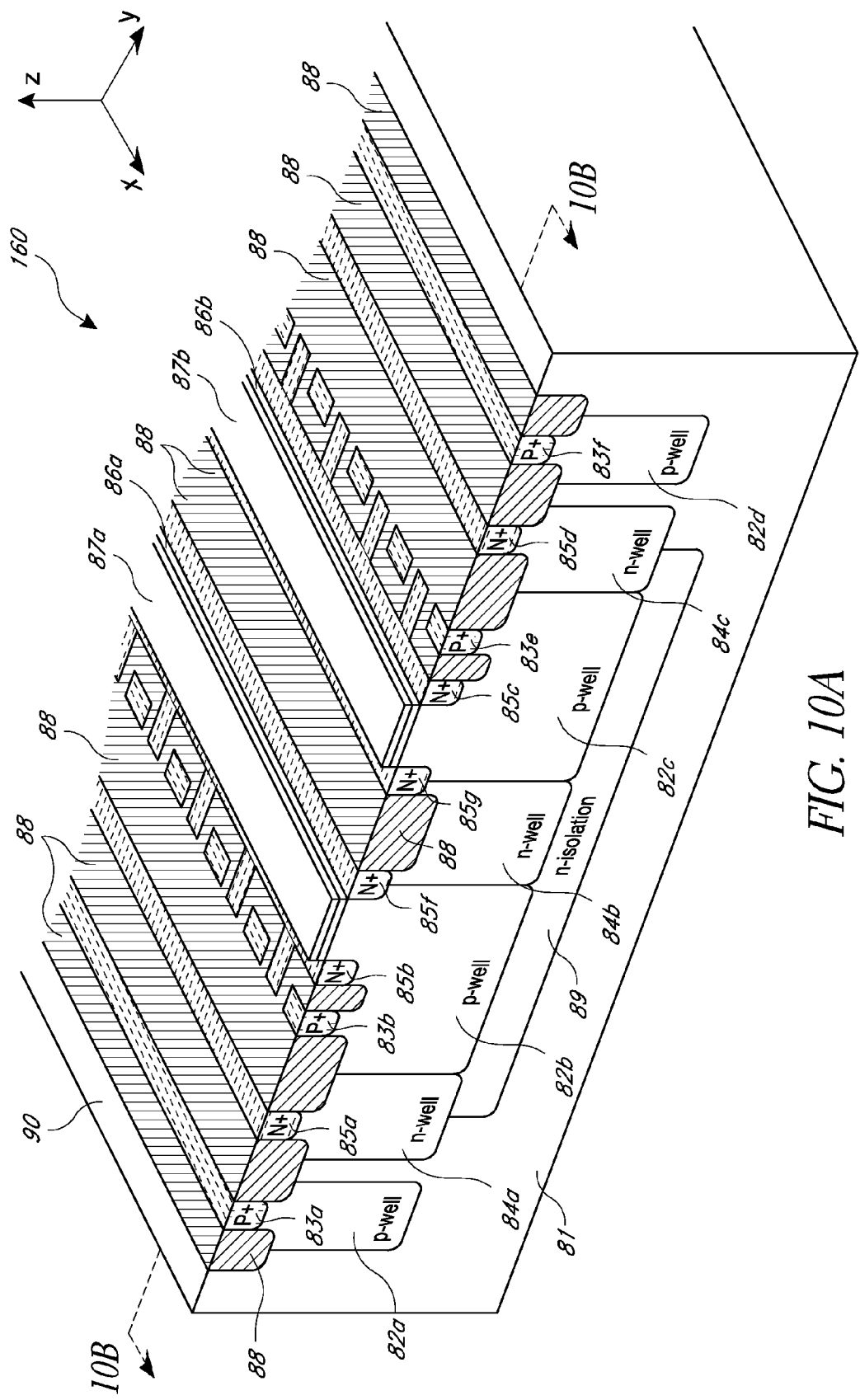
FIG. 10A is a schematic perspective view of a bi-directional protection device implementing the protection circuit of FIG. 9A according to one embodiment.

FIG. 10A is a schematic perspective view of a bi-directional protection device 160 implementing the protection circuit 140 of FIG. 9A according to one embodiment. The protection device 160 includes the p-type substrate 81, the first to fourth p-wells 82a-82d, the first and second p-type active areas 83a, 83b, the fifth and sixth p-type active areas 83e, 83f, the first to third n-wells 84a-84c, the first to fourth n-type active areas 85a-85d, the first and second gate oxide layers 86a, 86b, the first and second gate layers 87a, 87b, the oxide regions 88, the n-type isolation layer 89, and sixth and seventh n-type active areas 85f, 85g.

The bi-directional protection device 160 does not include the third and fourth p-type active areas 83c, 83d shown in FIGS. 4A-4B. Rather, the illustrated protection device 160 of FIG. 10A shows a configuration similar to the protection device 80 of FIG. 4A-4B except that the third and fourth p-type active areas 83c, 83d have been replaced with the sixth and seventh n-type active areas 85f, 85g, respectively. By replacing the third and fourth p-type active areas 83c, 83d with the sixth and seventh n-type active areas 85f, 85g, respectively, NMOS transistor structures can be formed in the protection device 160 to incorporate extra control in the turn-on response of the protection device, which can be useful in a variety of applications, including, for example, applications using very low operating voltage processes. For example, in the configuration illustrated in FIG. 10A, active areas of the same doping polarity have been provided on opposing sides of the first and second gate layers 87a, 87b.

Figure 10B:
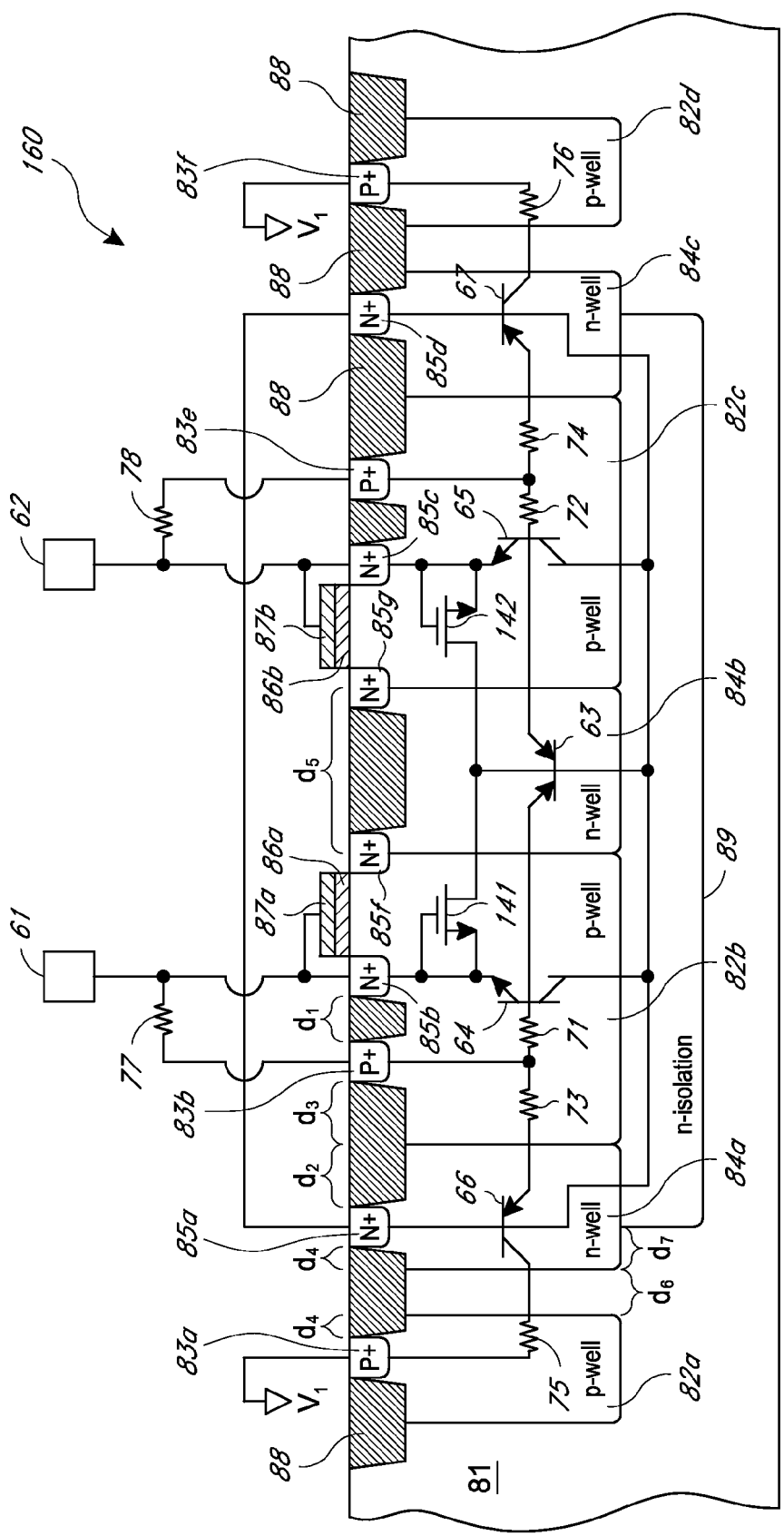
FIG. 10B is an annotated cross section view of the protection device of FIG. 10A, taken along the lines 10B-10B.

FIG. 10B is a cross section view of the protection device 160 of FIG. 10A, taken along the lines 10B-10B. The protection device 160 includes the p-type substrate 81, the first to fourth p-wells 82a-82d, the first and second p-type active areas 83a, 83b, the fifth and sixth p-type active areas 83e, 83f, the first to third n-wells 84a-84c, the first to fourth n-type active areas 85a-85d, the first and second gate oxide layers 86a, 86b, the first and second gate layers 87a, 87b, the oxide regions 88, the n-type isolation layer 89, and the sixth and seventh n-type active areas 85f, 85g.

The cross section has been annotated to show examples of circuit devices formed from the illustrated structure, such as the bi-directional bipolar transistor 63, the first and second NPN bipolar transistors 64, 65, the first and second PNP bipolar transistors 66, 67, the first to sixth resistors 71-76, and the first and second NMOS transistors 141, 142. Additionally, the cross section has been annotated to show the seventh and eighth resistors 77, 78, which can be included in certain implementations, and which can be formed by using, for example, n-diffusion and/or poly silicon. Furthermore, the cross section has been annotated to show the first and second pads 61, 62 as well as electrical connections within the protection device 80 and to the pads as shown in FIG. 9A.

The cross-section of FIG. 10B includes similar circuit devices as the cross-section of FIG. 4B, except that the protection device 160 further includes the first and second NMOS transistors 141, 142, which were described above with reference to FIG. 9A. For example, the first NMOS transistor 141 includes a body formed from the second p-well 82b, a gate formed from the first gate layer 87a, a source formed from the second n-type active area 85b, and a drain formed from the sixth n-type active area 85f. Additionally, the second NMOS transistor 142 includes a body formed from the third p-well 82c, a gate formed from the second gate layer 87b, a source formed from the third n-type active area 85c, and a drain formed from the seventh n-type active area 85g. As illustrated in FIG. 10B, the first and second gate layers 87a, 87b can be electrically connected to the first and second pads 61, 62. However, in other implementations, the first and second gate layers 87a, 87b can be electrically connected in other ways, such as to the first and second control blocks 151, 152 of FIG. 9B.

Figure 11A:
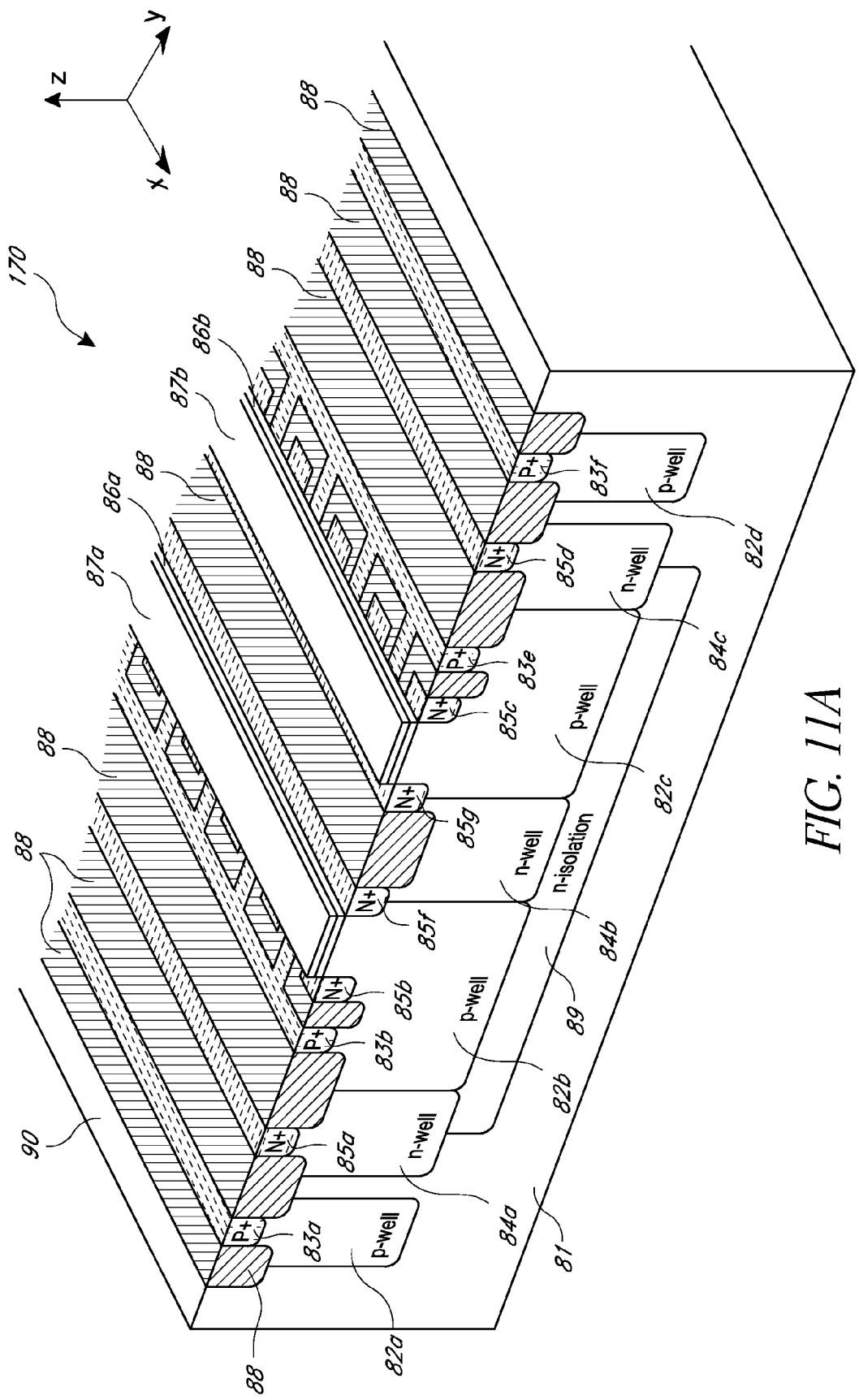
FIG. 11A is a schematic perspective view of a bi-directional protection device implementing the protection circuit of FIG. 9A according to another embodiment.

FIG. 11A is a schematic perspective view of a bi-directional protection device 170 implementing the protection circuit 140 of FIG. 9A according to another embodiment. The protection device 170 includes the p-type substrate 81, the first to fourth p-wells 82a-82d, the first and second p-type active areas 83a, 83b, the fifth and sixth p-type active areas 83e, 83f, the first to third n-wells 84a-84c, the first to fourth n-type active areas 85a-85d, the first and second gate oxide layers 86a, 86b, the first and second gate layers 87a, 87b, the oxide regions 88, the n-type isolation layer 89, and the sixth and seventh n-type active areas 85f, 85g.

The protection device 170 of FIG. 11A can be similar to the protection device 160 described above with reference to FIGS. 10A-10B. However, in contrast to the protection device 160 of FIGS. 10A-10B, the second and fifth p-type active areas 83b, 83e and the second and third n-type active areas 85b, 85c have been arranged in a configuration that is complementary. For example, in the implementation illustrated in FIG. 11A, the second n-type active area 85b includes a plurality of island regions disposed along the x-direction and the second p-type active area 83b includes an elongated region disposed along the x-direction and protruding regions extending in the y-direction such that each of the protruding regions extends between two of the island regions. Similarly, the third n-type active area 85c includes a plurality of island regions disposed along the x-direction and the fifth p-type active area 83e includes an elongated region disposed along the x-direction and protruding regions extending in the y-direction such that each of the protruding regions extends between two of the island regions. Configuring the second and fifth p-type active areas 83b, 83e and the second and third n-type active areas 85b, 85c in this manner can be used to increase holding voltage of the protection device 170 of FIG. 11A relative to the protection device 160 of FIGS. 10A-10B, while maintaining a similar breakdown voltage. The increase in holding voltage can be achieved by enhancing the PNP action by increasing p-type active area and decreasing n-type active area.

Figure 11B:
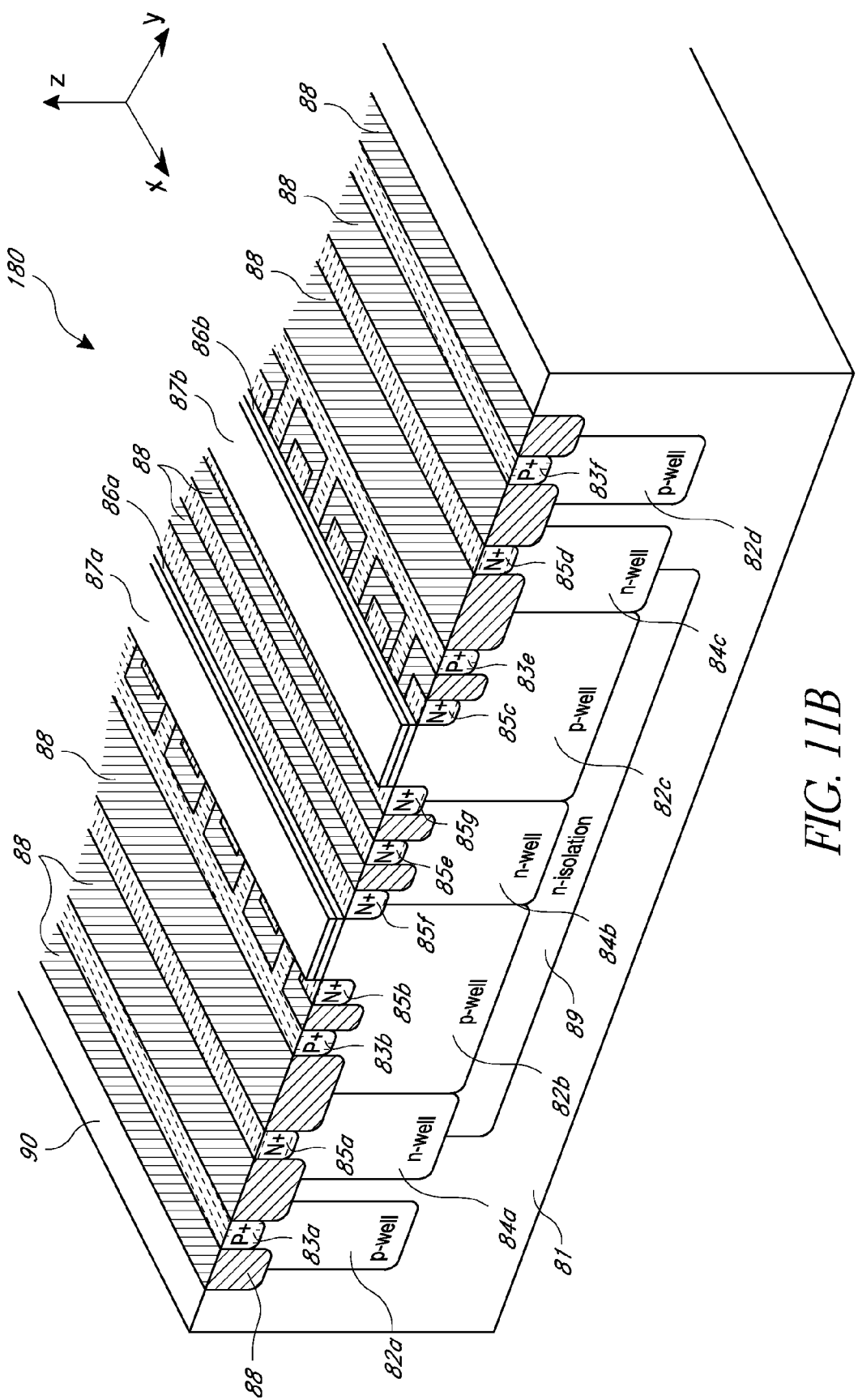
FIG. 11B is a schematic perspective view of a bi-directional protection device implementing the protection circuit of FIG. 9A according to yet another embodiment.

FIG. 11B is a schematic perspective view of a bi-directional protection device 180 implementing the protection circuit 140 of FIG. 9A according to yet another embodiment. The protection device 180 includes the p-type substrate 81, the first to fourth p-wells 82a-82d, the first and second p-type active areas 83a, 83b, the fifth and sixth p-type active areas 83e, 83f, the first to third n-wells 84a-84c, the first to seventh n-type active areas 85a-85g, the first and second gate oxide layers 86a, 86b, the first and second gate layers 87a, 87b, the oxide regions 88, and the n-type isolation layer 89.

The protection device 180 of FIG. 11B can be similar to the protection device 170 described above with reference to FIG. 11A. However, in contrast to the protection device 170 of FIG. 11A, the protection device 170 further includes the fifth n-type active area 85e disposed between the sixth and seventh n-type active areas 85f, 85g in the second n-well 84b. Including the fifth n-type active area 85e in the second n-well 84b can increase the concentration of electrons in the second n-well 84b, thereby enhancing the surface conduction and the current handling capability of the bi-directional bipolar transistor 63. The inclusion of the fifth n-type active area 85e can also increase the carrier concentration in the base of the bi-directional bipolar transistor 63 of FIG. 9A, which can aid in controlling the bipolar device gain and fine-tuning the protection device activation breakdown.

Figures 12A, 12B:
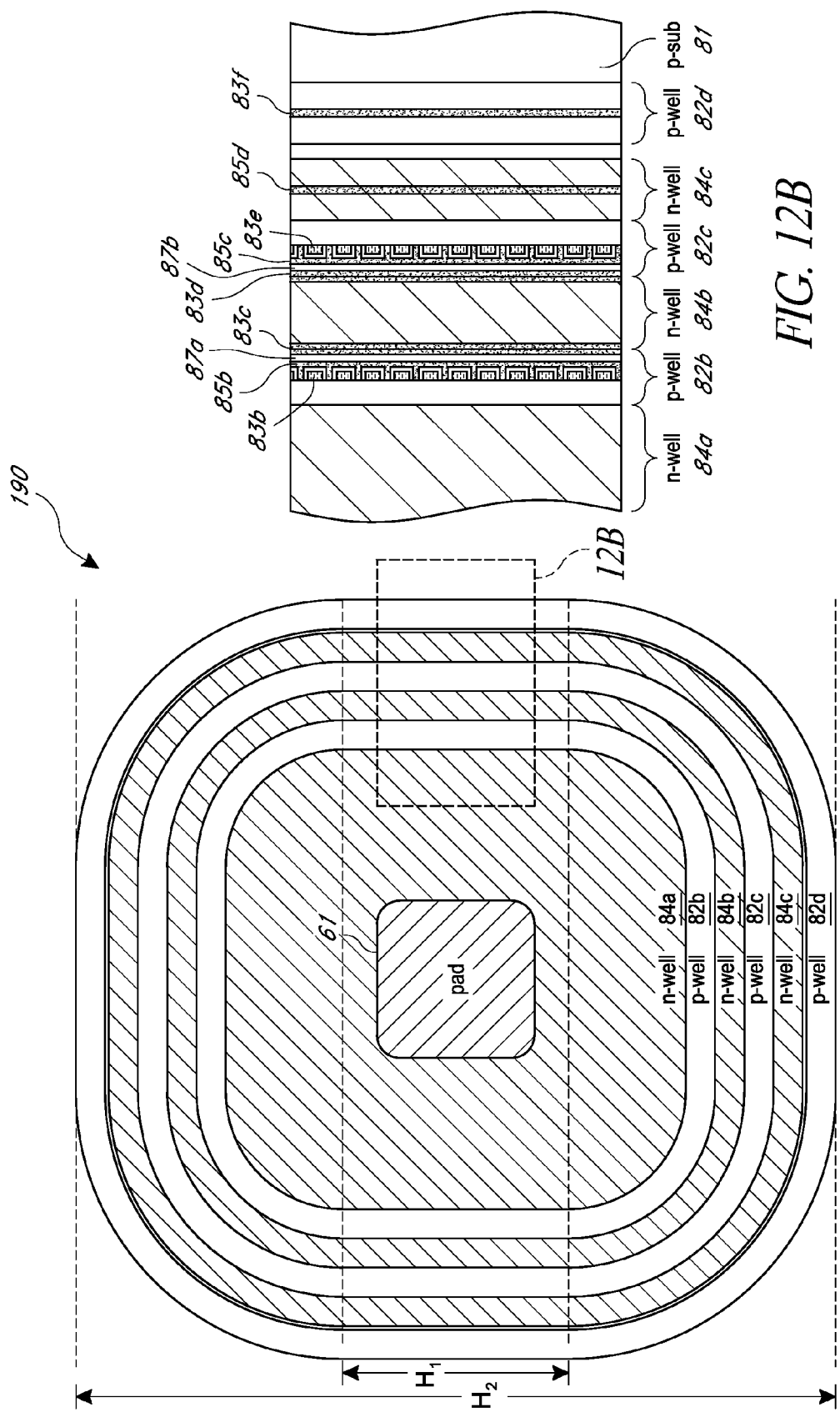
FIG. 12A is a schematic top plan layout view of a protection device according to one embodiment.
FIG. 12B is an enlarged partial top plan layout view of one implementation of the protection device of FIG. 12A.

FIG. 12A is a schematic top plan view of a protection device 190 according to one embodiment. The protection device 190 includes the first to third n-wells 84a-84c and the second to fourth p-wells 82b-82d, and has been configured to surround the first pad 61. The protection device 190 does not include the first p-well 82a shown in FIGS. 4A-8 and 10A-11B.

Although only the p-wells and n-wells of the protection device have been illustrated in FIG. 12A, the protection device 190 can include other structures, such as p-type active areas and n-type active areas, contacts and metallization, an isolation layer, gate oxide layers, gate layers, and/or oxide regions. Skilled artisans will appreciate that these details have been omitted from FIG. 12A for clarity.

In the configuration illustrated in FIG. 12A, the first pad 61 has been formed over the first n-well 84a. Additionally, the second p-well 82b has been configured to surround the first n-well 84a, and the second n-well 84b has been configured to surround the second p-well 82b. Furthermore, the third p-well 82c has been configured to surround the second n-well 84b, and the third n-well 84c has been configured to surround the third p-well 82c. Additionally, the fourth p-well 82d has been configured to surround the third n-well 84c and is spaced from the third n-well 84c such that the fourth p-well 82d and the third n-well 84c do not abut. In certain implementations, an n-type isolation layer is disposed under the first and second n-wells 84a, 84b, under the second and third p-wells 82b, 82c, and under at least a portion of the third n-well 84c.

As shown in FIG. 12A, in certain implementations, one or more of the p-wells and/or n-wells of the protection device can be formed as rings. By configuring the protection device in this manner, the current handling capability of the device can be enhanced. Additionally, configuring the n-wells and p-wells as rings can reduce device footprint. For example, in the illustrated configuration the fourth p-well 82d can operate as a guard ring for isolating the protection device 190 from other devices included on the substrate, and the first p-well 82a shown in FIGS. 4A-8 and 10A-11B is not used in this configuration. In one implementation, the width $H_1$ of the substantially straight portion of the each side is in the range of about 60 μm to about 90 μm, for example, about 80 μm, and the width $H_2$ of the largest ring is in the range of about 220 μm to about 170 μm, for example, about 198 μm.

FIG. 12B is an enlarged partial top plan view of one implementation of the protection device 190 of FIG. 12A. The plan view shows a portion of the protection device 190 within the box 12B of FIG. 12A. The illustrated portion of the protection device includes the first to third n-wells 84a-84c, the second to fourth p-wells 82b-82d, the p-type substrate 81, the second to fifth p-type actives areas 83b-83f, the second to fourth n-type active areas 85b-85d, and the first and second gate layers 87a, 87b. The illustrated structures have been arranged in a configuration similar to that shown in FIGS. 4A-4B. However, persons having ordinary skill in the art will appreciate that the protection device can be modified to include n-type active areas, p-type active areas, and/or gate layers arranged in any of the configurations shown in FIGS. 5A-8 and 10A-11B. In certain implementations, the devices can be optimized to provide predetermined bi-directional current-voltage blocking and operation characteristics.

Figure 13A:
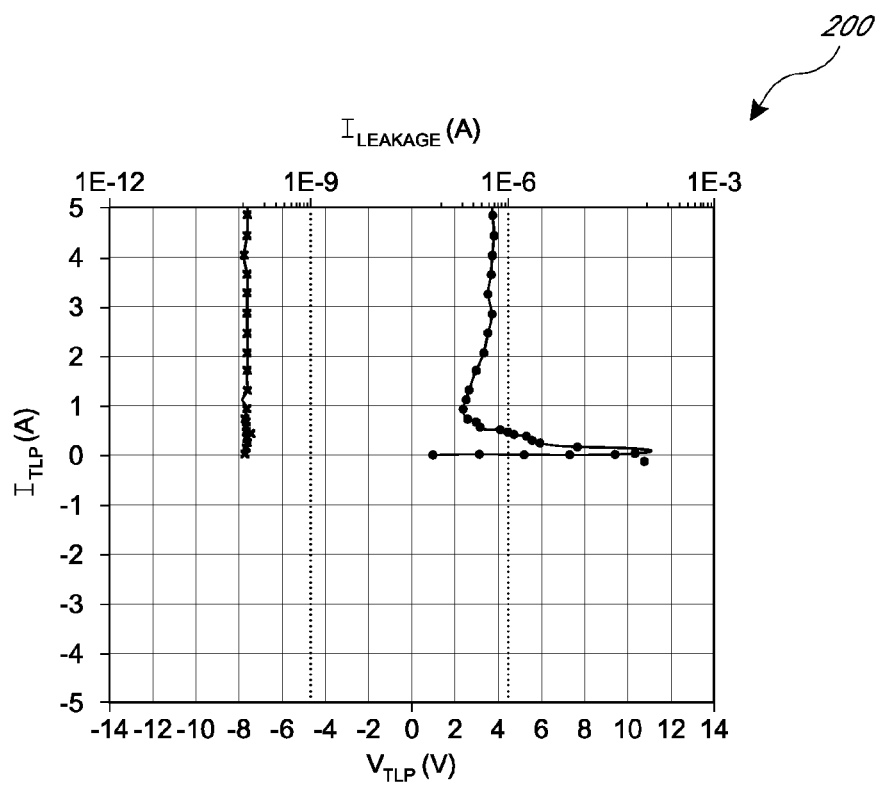
FIG. 13A is a graph of transmission line pulsing (TLP) laboratory data in a forward direction for one example of the protection device of FIG. 4A.
Figure 13B:
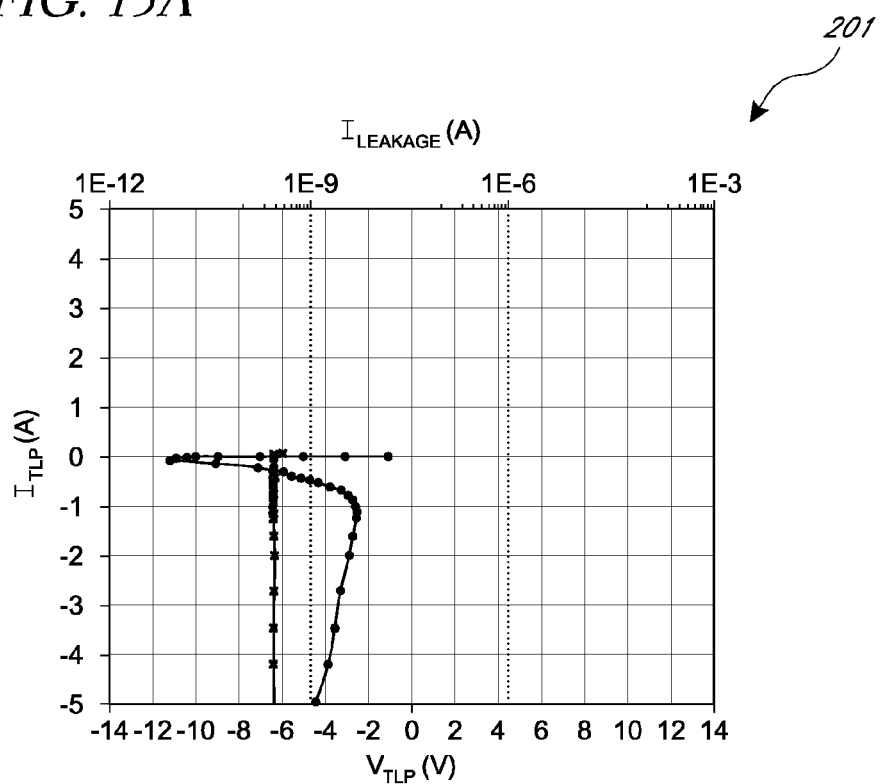
FIG. 13B is a graph of TLP laboratory data in a reverse direction for one example of the protection device of FIG. 4A.

FIG. 13A is a first graph 200 of transmission line pulsing (TLP), 100 ns pulse width and 2 ns rise time, laboratory data 200 in a forward direction for one example of the protection device of FIG. 12A that uses the arrangement of active areas and gate structures shown in FIG. 5A. FIG. 13B is a second graph 201 of TLP laboratory data in a reverse direction. Although FIG. 13A illustrates one example of bi-directional blocking characteristics, the bi-directional blocking characteristics of the protection device can be modified to achieve, for example, very low to medium level symmetric or asymmetric blocking and conduction current-voltage characteristics, such as voltage blocking characteristics between +/−(3 V) to about +/−(15V).

The illustrated first and second graphs 200, 201 are laboratory data showing TLP voltage versus TLP current and TLP current versus leakage current at predetermined leakage test voltages, which are +/−5 V in this example. The first and second graphs 200, 201 illustrate that the pad protection circuit can exhibit bidirectional protection response. For example, the pad protection circuit has a TLP forward trigger voltage $V_{T\text{-}F}$ of about 10.5 V, a TLP forward holding voltage $V_{H\text{-}F}$ of about 2 V, a reverse TLP trigger voltage $V_{T\text{-}F}$ of about 10.5 V, and a reverse holding voltage $V_{H\text{-}R}$ of about 2 V. Additionally, the pad protection circuit has a relatively low leakage of less than about 500 pA at operating conditions, in the case of this configuration for applications operating between about −8 and about 8 V and tuned to trigger in the range of about 10 V to about 12 V in the positive direction and in the range of about −10 V to about −12 V in the negative direction. The protection device can be used for a variety of applications, including low noise transceivers applications operating within +/−(8 V). In different configurations, the bidirectional trigger voltage can be lowered by forming the NMOS transistors 141, 142 of FIG. 9A and/or by including the seventh and eighth resistors 77, 78 of FIG. 9A, thereby allowing the protection device to operate in very low voltage applications using a relatively low trigger voltage, for instance, trigger voltages within +/−5 V.

In the embodiments described above, the protections devices can include layers, regions, and/or wells having n-type or p-type dopants. In other embodiments, the doping types of all the layers, regions, and wells of the protection devices can be opposite to those described and shown in the above embodiments, and the same principles and advantages can still apply to the other embodiments. For example, a complementary version of the protection device of FIGS. 4A-B can be formed using an n-type substrate or using a p-type substrate having an n-type epitaxial layer formed thereon. In such embodiments, the n-type isolation layer 89 of the protection device 80 of FIG. 4A is replaced with a p-type isolation layer, and the n-wells and p-wells of the protection device 80 can be replaced with p-wells and n-wells, respectively. Additionally, the n-type active regions and the p-type active regions can be replaced with p-type active regions and n-type active regions, respectively. Similarly, complementary versions of the protection devices shown in FIGS. 5A-8 and 10A-11B are also possible under the same principle described above.

Applications

Devices employing the above described schemes can be implemented into various electronic devices and interface applications. Examples of the electronic devices can include, but are not limited to, consumer electronic products, parts of the consumer electronic products, electronic test equipment, high robustness industrial and automotive applications, etc. Examples of the electronic devices can also include circuits of optical networks or other communication networks. The consumer electronic products can include, but are not limited to, a mobile phone, a telephone, a television, a computer monitor, a computer, a hand-held computer, a personal digital assistant (PDA), an automobile, a vehicle engine management controller, a transmission controller, a seatbelt controller, an anti-lock brake system controller, a camcorder, a camera, a digital camera, a portable memory chip, a washer, a dryer, a washer/dryer, a copier, a facsimile machine, a scanner, a multi functional peripheral device, etc. Further, the electronic device can include unfinished products, including those for industrial, medical and automotive applications.

The foregoing description and claims may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. An apparatus for providing protection from transient electrical events, the apparatus comprising:
   a substrate;
   a first pad and a second pad disposed over the substrate;
   wherein the substrate comprises a first well, a second well, and a third well, wherein the first well has a doping of a first type, wherein the second and third wells have a doping of a second type opposite to the first type, wherein the second well is disposed on a first side of the first well, wherein the third well is disposed on a second side of the first well opposite the first side;
   wherein the substrate further comprises a fourth well and a fifth well, wherein the fourth well has a doping of the first type and is disposed on a side of the second well opposite the first well, and wherein the fifth well has a doping of the first type and is disposed on a side of the third well opposite the first well;

wherein the substrate further comprises a first active region, a second active region, a third active region, a fourth active region, a fifth active region, and a sixth active region, wherein the first and second active regions have a doping of the second type, wherein the fifth and sixth active regions have a doping of the first type, wherein the first and fifth active regions are disposed in the second well and are electrically coupled to the first pad, wherein the second and sixth active regions are disposed in the third well and are electrically coupled to the second pad, wherein the third active region is disposed along a boundary of the first and second wells and the fourth active region is disposed along a boundary of the first and third wells; and a first implant blocking structure and a second implant blocking structure, the first implant blocking structure disposed between the third and fifth active regions and the second implant blocking structure disposed between the fourth and sixth active regions;

wherein the first pad is disposed over the fourth well, and wherein the second well, the first well, the third well, and the fifth well each comprise annular rings surrounding the fourth well, wherein the second well is disposed between the fourth and first wells, and wherein the third well is disposed between the fifth and first wells; and wherein the second well, the first well, and the third well are configured to operate as an emitter/collector, a base, and a collector/emitter of a bi directional bipolar transistor, respectively, such that the apparatus is configured to provide bi directional blocking protection from a transient electrical event received between the first and second pads.

2. The apparatus of claim 1, wherein the first type is n-type, and the second type is p-type.

3. The apparatus of claim 1, wherein the substrate has a doping of the second type.

4. The apparatus of claim 1, wherein the substrate further comprises an isolation layer disposed beneath the first, second and third wells and beneath at least a portion of the fourth and fifth wells, wherein the isolation layer has a doping of the first type.

5. The apparatus of claim 4, wherein at least a portion of the fifth active region is disposed between the first and third active regions, and wherein at least a portion of the sixth active region is disposed between the second and fourth active regions.

6. The apparatus of claim 4, wherein the fifth active region, the second well, and the isolation layer are configured to operate as an emitter, a base, and a collector of a first vertical bipolar transistor, respectively, and wherein the sixth active region, the third well, and the isolation layer are configured to operate as an emitter, a base, and a collector of a second vertical bipolar transistor, respectively.

7. The apparatus of claim 1, wherein the first implant blocking structure comprises a first gate structure and the second implant blocking structure comprises a second gate structure, wherein the first gate structure is disposed over a surface of the substrate between the third and fifth active regions, and wherein the second gate structure is disposed over the surface of the substrate between the fourth and sixth active regions.

8. The apparatus of claim 7, wherein the third and fourth active regions have a doping of the first type, and wherein the second well, the fifth active region, the third active region, and the first gate are configured to operate as a body, a source, a drain, and a gate of a first metal oxide semiconductor (MOS) transistor, respectively, and wherein the third well, the sixth active region, the fourth active region, and the second gate are configured to operate as a body, a source, a drain, and a gate of a second metal oxide semiconductor (MOS) transistor, respectively.

9. The apparatus of claim 8, further comprising a first control circuit electrically coupled to the gate of the first MOS and a second control circuit electrically coupled to the gate of the second MOS.

10. The apparatus of claim 7, wherein the third and fourth active regions have a doping of the second type.

11. The apparatus of claim 1, wherein the first and second implant blocking structures each comprise an oxide region.

12. The apparatus of claim 1, further comprising a first external resistor and a second external resistor, wherein the first external resistor is disposed between the first active region and the fifth active region and the second external resistor is disposed between the second active region and the sixth active region, and wherein the first and second external resistors each have a resistance in the range of about $0.2\Omega$ to about $200\Omega$.

13. The apparatus of claim 1, wherein the substrate further comprises a sixth well and a seventh well each having a doping of the second type, wherein the sixth well is disposed on a side of the fourth well opposite the second well, and wherein the seventh well is disposed on a side of the fifth well opposite the third well, and wherein the sixth well is spaced from the fourth well and the seventh well is spaced from the fifth well.

14. The apparatus of claim 1, further comprising an annular guard ring surrounding an outermost region of the first, second, third, fourth, and fifth wells, wherein the annular guard ring has a doping of the second type and is spaced from the fifth well.

15. The apparatus of claim 1, wherein the substrate further comprises an input/output circuit electrically connected between the first and second pads and monolithically integrated on the substrate.

16. The apparatus of claim 15, wherein each electrical path between the first pad and the second pad through the input/output circuit includes at least two p-n junctions electrically connected in series for extending core circuit breakdown level.

17. The apparatus of claim 1, further comprising an input/output circuit electrically connected between the first and second pads and disposed on a separate substrate.

18. An apparatus for providing protection from transient electrical events, the apparatus comprising;
   a substrate;
   a first pad and a second pad disposed over the substrate;
   wherein the substrate comprises a first well, a second well, and a third well, wherein the first well has a doping of a first type, wherein the second and third wells have a doping of a second type opposite to the first type, wherein the second well is disposed on a first side of the first well, wherein the third well is disposed on a second side of the first well opposite the first side;
   wherein the substrate further comprises a first active region, a second active region, a third active region, a fourth active region, a fifth active region, and a sixth active region, wherein the first and second active regions have a doping of the second type, wherein the fifth and sixth active regions have a doping of the first type, wherein the first and fifth active regions are disposed in the second well and are electrically coupled to the first pad, wherein the second and sixth active regions are disposed in the third well and are electrically coupled to the second pad, wherein the third active region is disposed along a boundary of the first and second wells and the fourth active region is disposed along a boundary of the first and third wells; and a first implant blocking structure and a second implant blocking structure, the first implant blocking structure disposed between the third and fifth active regions and the second implant blocking structure disposed between the fourth and sixth active regions;

wherein the substrate further comprises a seventh active region disposed in the first well between the third and fourth active regions, wherein the seventh active region has a doping of the first type; and wherein the second well, the first well, and the third well are configured to operate as an emitter/collector, a base, and a collector/emitter of a bi directional bipolar transistor, respectively, such that the apparatus is configured to provide bi directional blocking protection from a transient electrical event received between the first and second pads.

19. An apparatus for providing protection from transient electrical events, the apparatus comprising;

a substrate;

a first pad and a second pad disposed over the substrate;

wherein the substrate comprises a first well, a second well, and a third well, wherein the first well has a doping of a first type, wherein the second and third wells have a doping of a second type opposite to the first type, wherein the second well is disposed on a first side of the first well, wherein the third well is disposed on a second side of the first well opposite the first side;

wherein the substrate further comprises a first active region, a second active region, a third active region, a fourth active region, a fifth active region, and a sixth active region, wherein the first and second active regions have a doping of the second type, wherein the fifth and sixth active regions have a doping of the first type, wherein the first and fifth active regions are disposed in the second well and are electrically coupled to the first pad, wherein the second and sixth active regions are disposed in the third well and are electrically coupled to the second pad, wherein the third active region is disposed along a boundary of the first and second wells and the fourth active region is disposed along a boundary of the first and third wells;

wherein the first active region comprises a first plurality of island regions disposed along a first direction, and wherein the second active region comprises a second plurality of island regions disposed along the first direction; and a first implant blocking structure and a second implant blocking structure, the first implant blocking structure disposed between the third and fifth active regions and the second implant blocking structure disposed between the fourth and sixth active regions;

wherein the second well, the first well, and the third well are configured to operate as an emitter/collector, a base, and a collector/emitter of a bi directional bipolar transistor, respectively, such that the apparatus is configured to provide bi directional blocking protection from a transient electrical event received between the first and second pads.

20. The apparatus of claim 19, wherein the fifth active region comprises a first elongated region disposed along the first direction and a first plurality of protruding regions extending from the first elongated region along a second direction perpendicular to the first direction such that each of the first plurality of protruding regions extends between two of the first plurality of island regions, and wherein the sixth active region comprises a second elongated region disposed along the first direction and a second plurality of protruding regions extending from the second elongated region along the second direction such that each of the second plurality of protruding regions extends between two of the second plurality of island regions.

21. An apparatus for providing protection from transient electrical events, the apparatus comprising:

a substrate;

a first pad and a second pad disposed over the substrate;

wherein the substrate comprises a first well, a second well, and a third well, wherein the first well has a doping of a first type, wherein the second and third wells have a doping of a second type opposite to the first type, wherein the second well is disposed on a first side of the first well, wherein the third well is disposed on a second side of the first well opposite the first side;

wherein the substrate further comprises a fourth well and a fifth well, wherein the fourth well has a doping of the first type and is disposed on a side of the second well opposite the first well, and wherein the fifth well has a doping of the first type and is disposed on a side of the third well opposite the first well;

wherein the substrate further comprises a first active region, a second active region, a third active region, a fourth active region, a fifth active region, and a sixth active region, wherein the first and second active regions have a doping of the second type, wherein the fifth and sixth active regions have a doping of the first type, wherein the first and fifth active regions are disposed in the second well and are electrically coupled to the first pad, wherein the second and sixth active regions are disposed in the third well and are electrically coupled to the second pad, wherein the third active region is disposed along a boundary of the first and second wells and the fourth active region is disposed along a boundary of the first and third wells; and a first means for implant blocking and a second means for implant blocking, the first implant blocking means disposed between the third and fifth active regions and the second implant blocking means disposed between the fourth and sixth active regions;

wherein the first pad is disposed over the fourth well, and wherein the second well, the first well, the third well, and the fifth well each comprise annular rings surrounding the fourth well, wherein the second well is disposed between the fourth and first wells, and wherein the third well is disposed between the fifth and first wells; and wherein the second well, the first well, and the third well are configured to operate as an emitter/collector, a base, and a collector/emitter of a bi directional bipolar transistor, respectively, such that the apparatus is configured to provide bi directional blocking protection from a transient electrical event received between the first and second pads.

22. The apparatus of claim 21, wherein the substrate further comprises a means for electrically isolating the first well, the second well and the third well from the substrate.

23. The apparatus of claim 21, wherein the first implant blocking means comprises a first gate structure and the second implant blocking means comprises a second gate structure.

24. The apparatus of claim 21, wherein the first and second implant blocking means each comprise an oxide region.

25. A method of making a transient protection device, the method comprising:

forming a first well, a second well, and a third well in a substrate, wherein the first well has a doping of a first type, wherein the second and third wells have a doping of a second type opposite to the first type, wherein the second well is disposed on a first side of the first well, wherein the third well is disposed on a second side of the first well opposite the first side;

forming a fourth well and a fifth well in the substrate, wherein the fourth well has a doping of the first type and is disposed on a side of the second well opposite the first well, and wherein the fifth well has a doping of the first type and is disposed on a side of the third well opposite the first well;

forming a first pad and a second pad disposed over the substrate;

forming a first implant blocking structure and a second implant blocking structure;

forming a first active region, a second active region, a third active region, a fourth active region, a fifth active region, and a sixth active region in the substrate, wherein the first and second active regions have a doping of the second type, wherein the fifth and sixth active regions have a doping of the first type, wherein the first and fifth active regions are disposed in the second well and are electrically coupled to the first pad, wherein the second and sixth active regions are disposed in the third well and are electrically coupled to the second pad, wherein the third active region is disposed along a boundary of the first and second wells and the fourth active region is disposed along a boundary of the first and third wells, wherein the third and fifth active regions are disposed on opposite sides of the first implant blocking structure, wherein the fourth and sixth active regions are disposed on opposite sides of the second implant blocking structure; and wherein the first pad is disposed over the fourth well, and wherein the second well, the first well, the third well, and the fifth well each comprise annular rings surrounding the fourth well, wherein the second well is disposed between the fourth and first wells, and wherein the third well is disposed between the fifth and first wells; and configuring the second well, the first well, and the third well to operate as an emitter/collector, a base, and a collector/emitter of a bi directional bipolar transistor, respectively, such that bi directional blocking protection from a transient electrical event received between the first and second pads is provided.

26. The method of claim 25, wherein forming the first implant blocking structure comprises forming a first gate structure over the substrate, and wherein forming the second implant blocking structure comprises forming a second gate structure over the substrate.

* * * * *

UNITED STATES PATENT AND TRADEMARK OFFICE
CERTIFICATE OF CORRECTION

PATENT NO.         : 8,680,620 B2  
APPLICATION NO.    : 13/198208  
DATED              : March 25, 2014  
INVENTOR(S)        : Salcedo et al.

Page 1 of 1

It is certified that error appears in the above-identified patent and that said Letters Patent is hereby corrected as shown below:

In the Specification

In column 13 at line 26, Change "on on" to --on--.

In the Claims

In column 28 at line 47, In Claim 18, change "comprising;" to --comprising:--.

In column 29 at line 21, In Claim 19, change "comprising;" to --comprising:--.

Signed and Sealed this
Second Day of September, 2014

Michelle K. Lee
*Deputy Director of the United States Patent and Trademark Office*